US012685062B2

(12) United States Patent
Takahashi et al.

(10) Patent No.: US 12,685,062 B2
(45) Date of Patent: Jul. 14, 2026

(54) SUBSTRATE CLEANING DEVICE AND SUBSTRATE CLEANING METHOD

(71) Applicant: SCREEN HOLDINGS CO., LTD., Kyoto (JP)

(72) Inventors: Takuma Takahashi, Kyoto (JP); Tomoyuki Shinohara, Kyoto (JP); Junichi Ishii, Kyoto (JP); Kazuki Nakamura, Kyoto (JP); Takashi Shinohara, Kyoto (JP); Nobuaki Okita, Kyoto (JP); Yoshifumi Okada, Kyoto (JP)

(73) Assignee: SCREEN HOLDINGS CO., LTD. (JP)

( * ) Notice: Subject to any disclaimer, the term of this patent is extended or adjusted under 35 U.S.C. 154(b) by 31 days.

(21) Appl. No.: 18/292,878

(22) PCT Filed: Jun. 24, 2022

(86) PCT No.: PCT/JP2022/025407
§ 371 (c)(1),
(2) Date: Jan. 26, 2024

(87) PCT Pub. No.: WO2023/008024
PCT Pub. Date: Feb. 2, 2023

(65) Prior Publication Data
US 2025/0001462 A1 Jan. 2, 2025

(30) Foreign Application Priority Data
Jul. 28, 2021 (JP) ................................. 2021-123744

(51) Int. Cl.
H10P 72/00 (2026.01)
B08B 1/12 (2024.01)
(Continued)

(52) U.S. Cl.
CPC ............ H10P 72/0412 (2026.01); B08B 1/12 (2024.01); B08B 1/20 (2024.01); B08B 3/10 (2013.01);
(Continued)

(58) Field of Classification Search
None
See application file for complete search history.

(56) References Cited

U.S. PATENT DOCUMENTS 5,361,449 A * 11/1994 Akimoto ................. B08B 11/00
15/302
2009/0202951 A1 8/2009 Yamamoto et al.
(Continued)

FOREIGN PATENT DOCUMENTS

CN 110199378 A 9/2019
JP 02-264422 A 10/1990
(Continued)

OTHER PUBLICATIONS

International Search Report mailed Sep. 20, 2022 in corresponding PCT International Application No. PCT/JP2022/025407.
(Continued)

*Primary Examiner* — Kaj K Olsen
*Assistant Examiner* — Ryan L Coleman
(74) *Attorney, Agent, or Firm* — OSTROLENK FABER LLP

(57) ABSTRACT

A substrate cleaning device includes an upper holding device. The upper holding device holds a substrate in a horizontal attitude without rotating the substrate, while being in contact with an outer peripheral end of the substrate. A lower-surface brush wetted with a cleaning liquid is pressed against a lower-surface center region of the substrate held by the upper holding device. In this state, the lower-surface brush is rotated or moved with respect to the
(Continued)

lower-surface center region of the substrate. Thus, the lower-surface center region of the substrate is cleaned.

8 Claims, 19 Drawing Sheets

(51) Int. Cl.
  B08B 1/20        (2024.01)
  B08B 3/10        (2006.01)
  H10P 70/00       (2026.01)

(52) U.S. Cl.
  CPC .......... H10P 70/56 (2026.01); H10P 72/0414 (2026.01)

(56)            References Cited

U.S. PATENT DOCUMENTS

| | | | |
|---|---|---|---|
| 2012/0014689 A1 | 1/2012 | Ookouchi et al. ............ 396/611 |
| 2013/0098397 A1 | 4/2013 | Wang |
| 2014/0352736 A1 | 12/2014 | Yamamoto et al. |
| 2016/0126113 A1 | 5/2016 | Ishibashi |
| 2017/0221696 A1 | 8/2017 | Nishiyama |
| 2018/0151343 A1* | 5/2018 | Takiguchi ......... H01L 21/02013 |
| 2019/0181022 A1 | 6/2019 | Mouri et al. |
| 2019/0214245 A1 | 7/2019 | Nishiyama |
| 2020/0020563 A1 | 1/2020 | Nishida et al. |
| 2020/0030855 A1 | 1/2020 | Ishibashi |
| 2021/0210338 A1 | 7/2021 | Nishiyama |
| 2021/0249253 A1* | 8/2021 | Mai ................... H01L 21/67046 |
| 2021/0398827 A1 | 12/2021 | Mouri et al. |
| 2023/0268174 A1 | 8/2023 | Nishiyama |

FOREIGN PATENT DOCUMENTS

| | | | |
|---|---|---|---|
| JP | 03-206615 A | 9/1991 |
| JP | 2003-229398 A | 8/2003 |
| JP | 2009-194034 A | 8/2009 |
| JP | 2012-023209 A | 2/2012 |
| JP | 2013-115207 A | 6/2013 |
| JP | 2016-092158 A | 5/2016 |
| JP | 2019-106531 A | 6/2019 |
| TW | 201330148 A1 | 7/2013 |
| TW | I712081 B | 12/2020 |
| WO | WO 2021/053995 A1 | 3/2021 |

OTHER PUBLICATIONS

Office Action mailed Jun. 17, 2023 in corresponding Taiwanese Application No. 11220587890.
Office Action dated Jan. 10, 2025 in corresponding Korean Patent Application No. 10-2024-7006418.

* cited by examiner

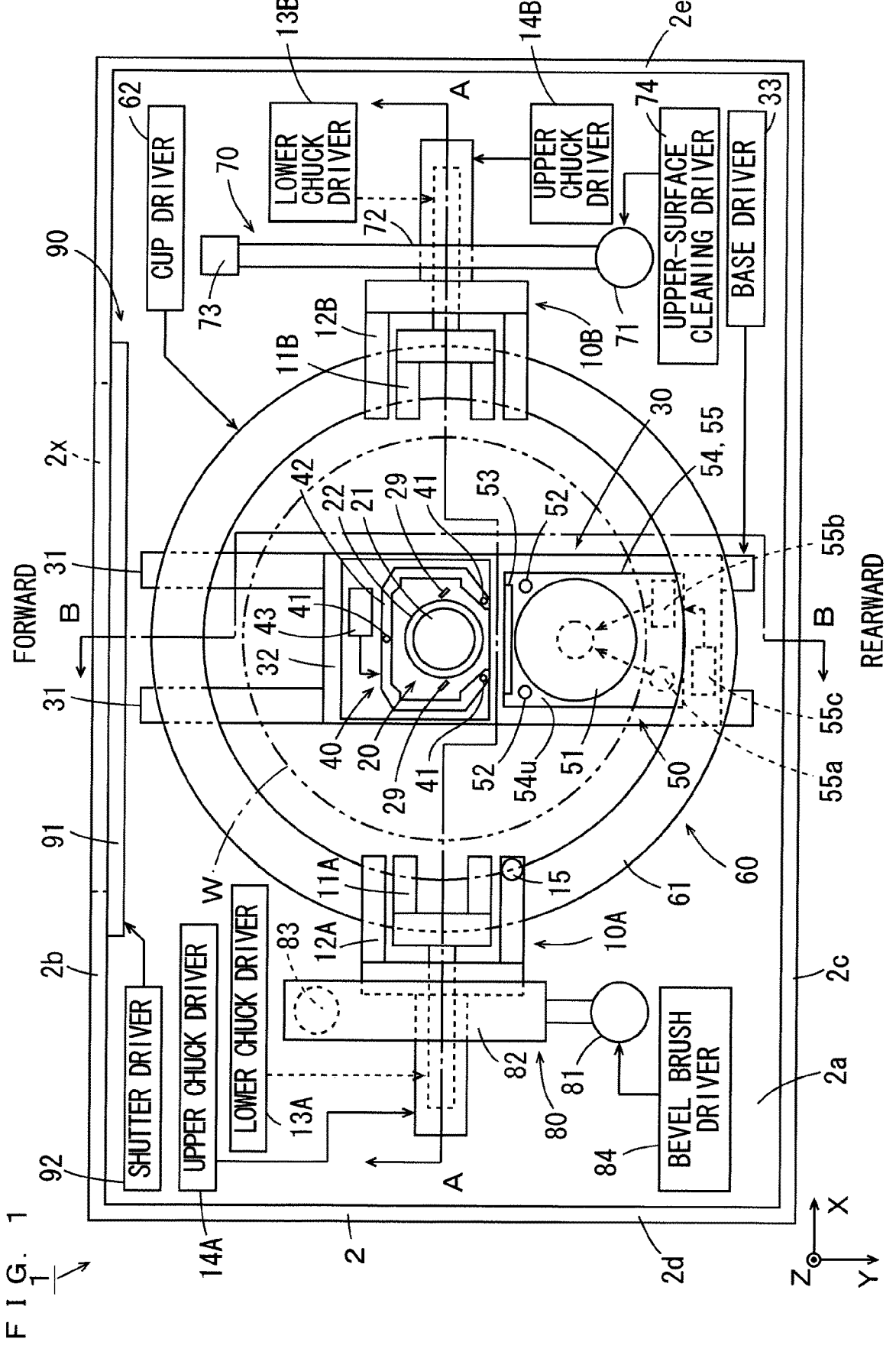
F I G. 1

F I G. 2
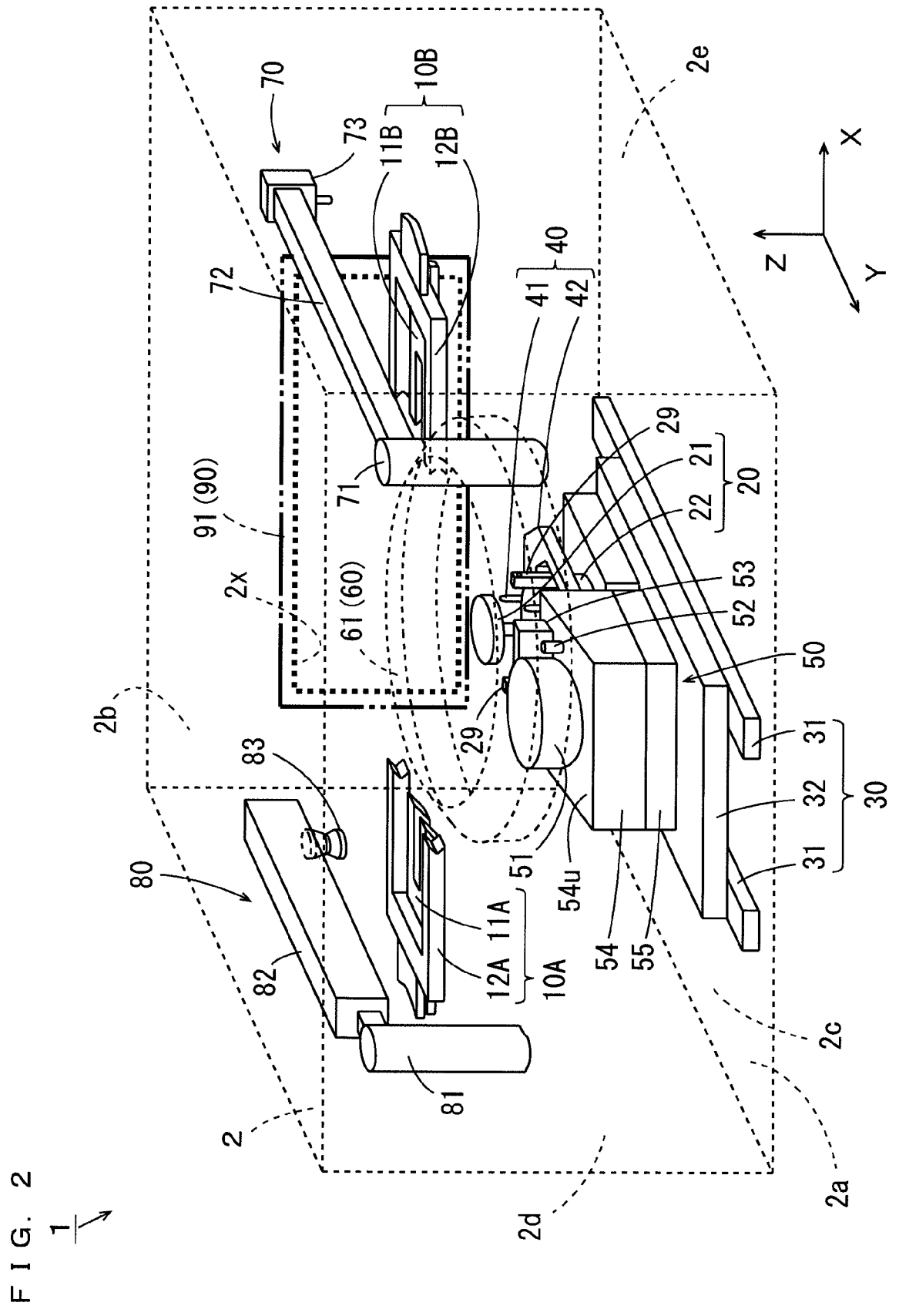

F I G. 3

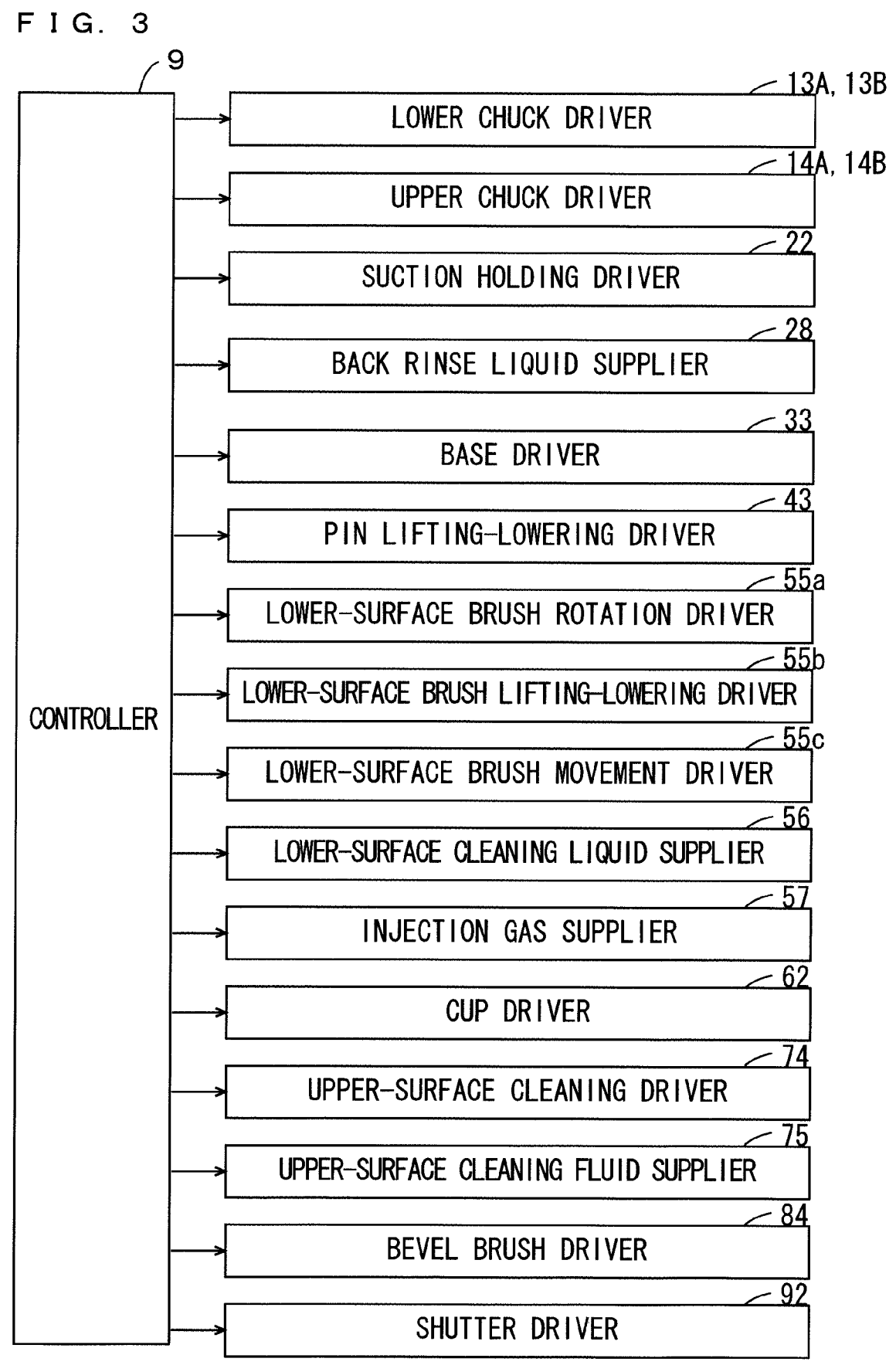

9

CONTROLLER 13A, 13B
LOWER CHUCK DRIVER 14A, 14B
UPPER CHUCK DRIVER

22
SUCTION HOLDING DRIVER

28
BACK RINSE LIQUID SUPPLIER

33
BASE DRIVER

43
PIN LIFTING-LOWERING DRIVER

55a
LOWER-SURFACE BRUSH ROTATION DRIVER

55b
LOWER-SURFACE BRUSH LIFTING-LOWERING DRIVER

55c
LOWER-SURFACE BRUSH MOVEMENT DRIVER

56
LOWER-SURFACE CLEANING LIQUID SUPPLIER

57
INJECTION GAS SUPPLIER

62
CUP DRIVER

74
UPPER-SURFACE CLEANING DRIVER

75
UPPER-SURFACE CLEANING FLUID SUPPLIER

84
BEVEL BRUSH DRIVER

92
SHUTTER DRIVER

FIG. 4
PLAN VIEW
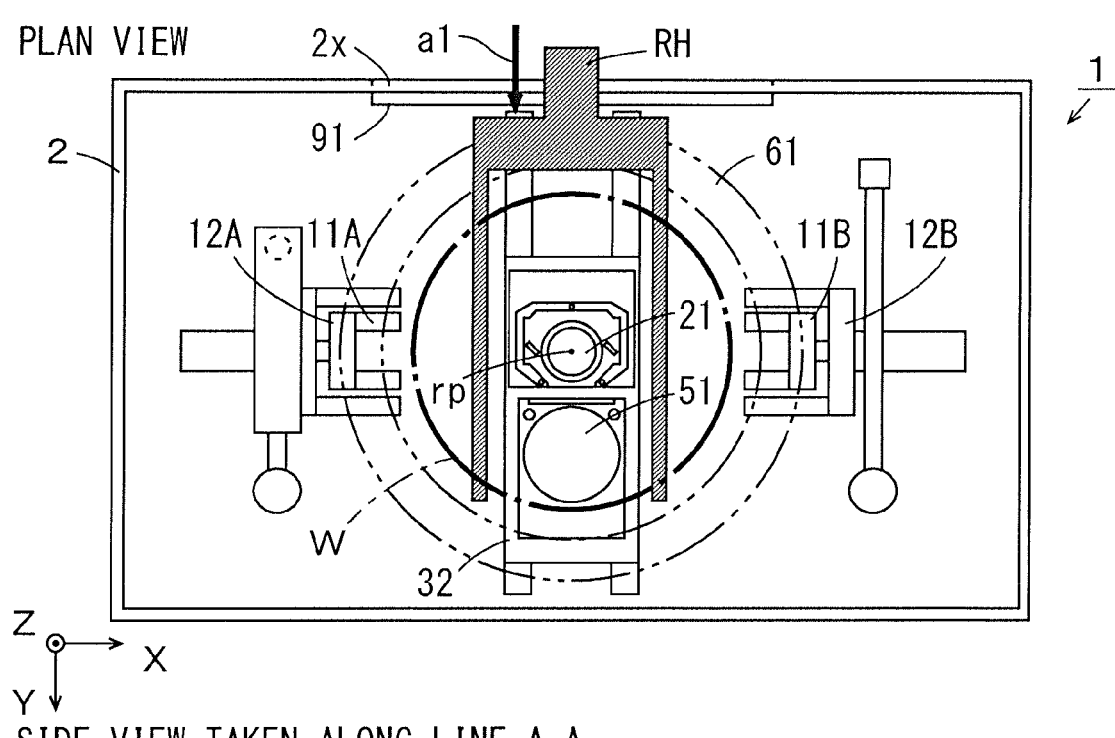
SIDE VIEW TAKEN ALONG LINE A-A
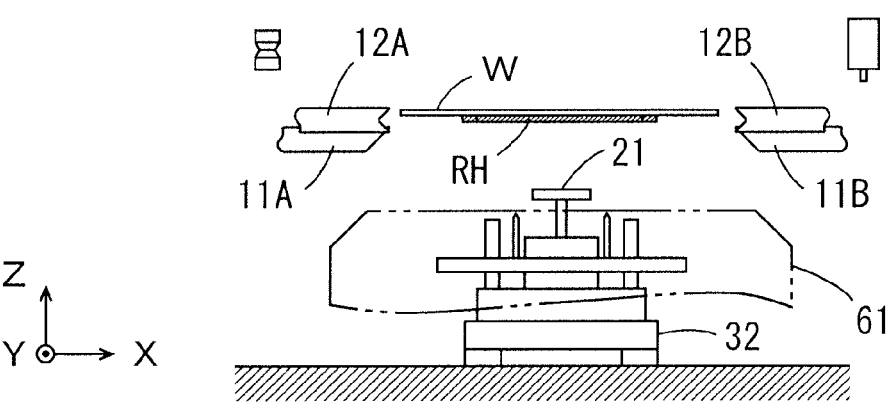
SIDE VIEW TAKEN ALONG LINE B-B
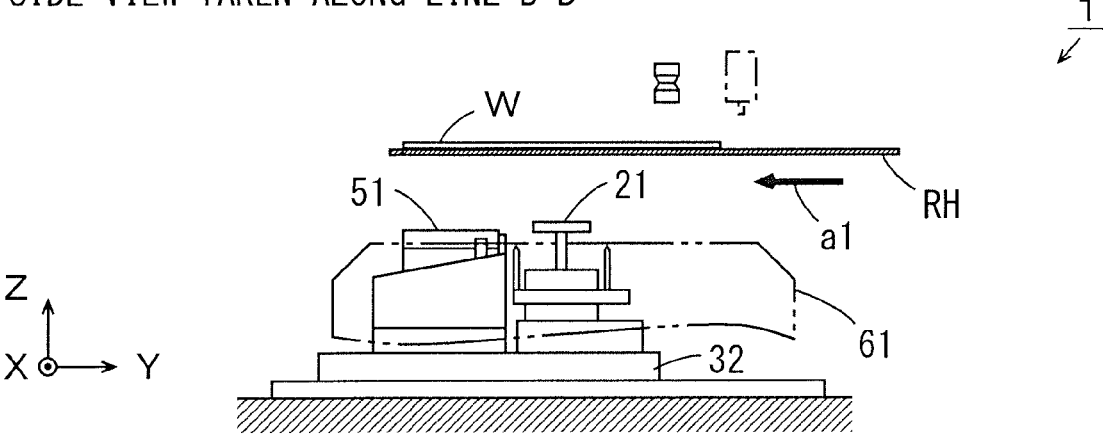

F I G. 5
PLAN VIEW
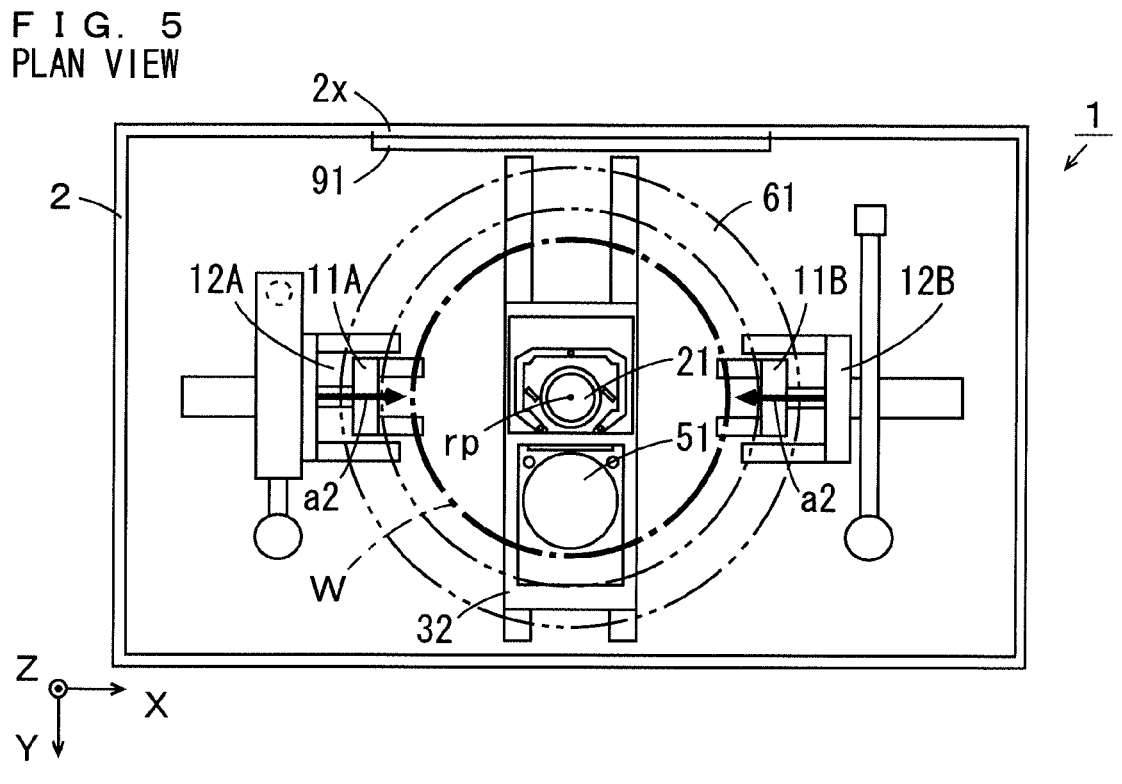
SIDE VIEW TAKEN ALONG LINE A-A
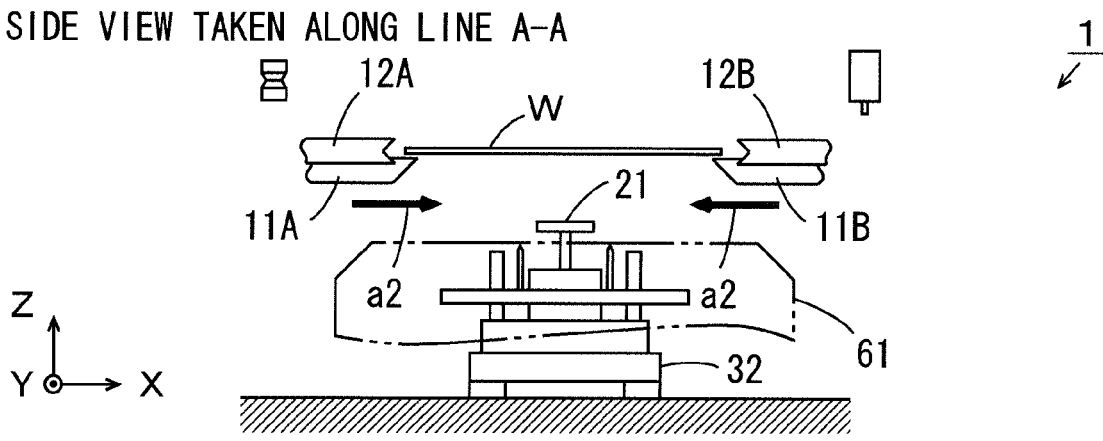
SIDE VIEW TAKEN ALONG LINE B-B
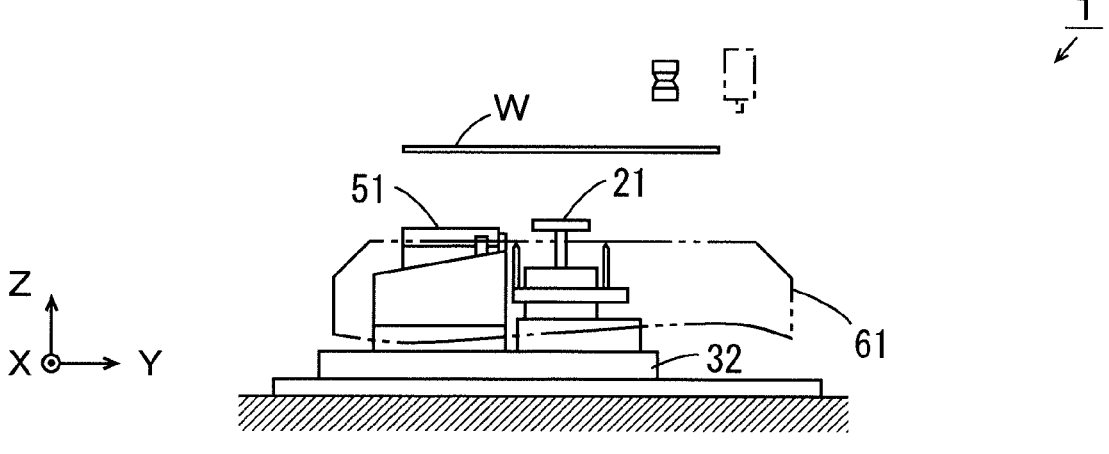

FIG. 6
PLAN VIEW
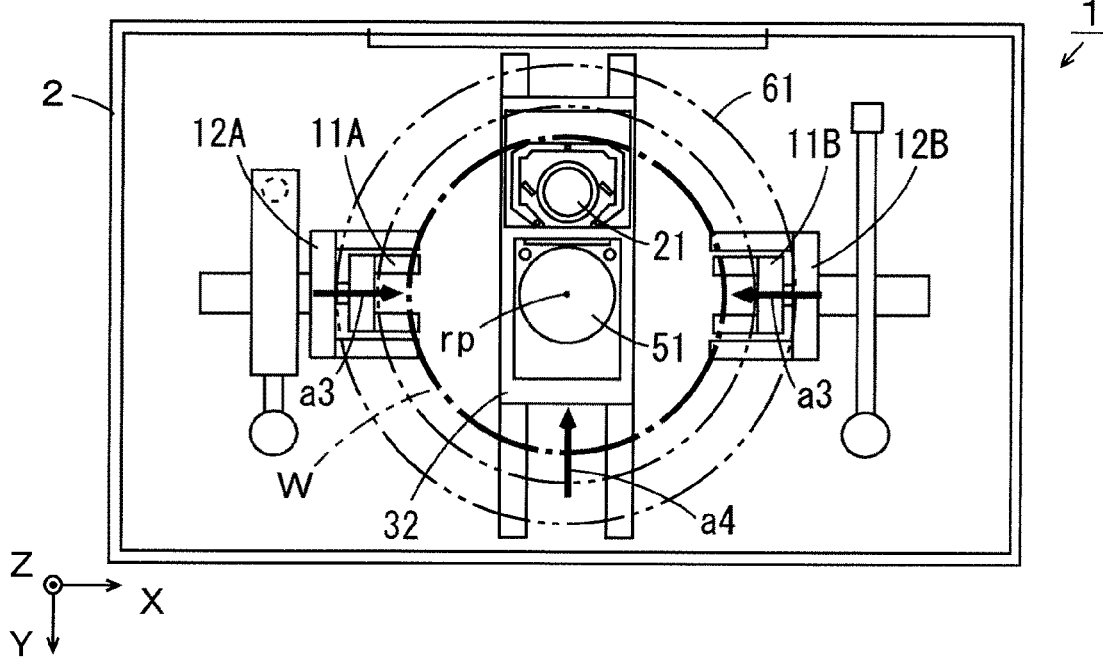
SIDE VIEW TAKEN ALONG LINE A-A
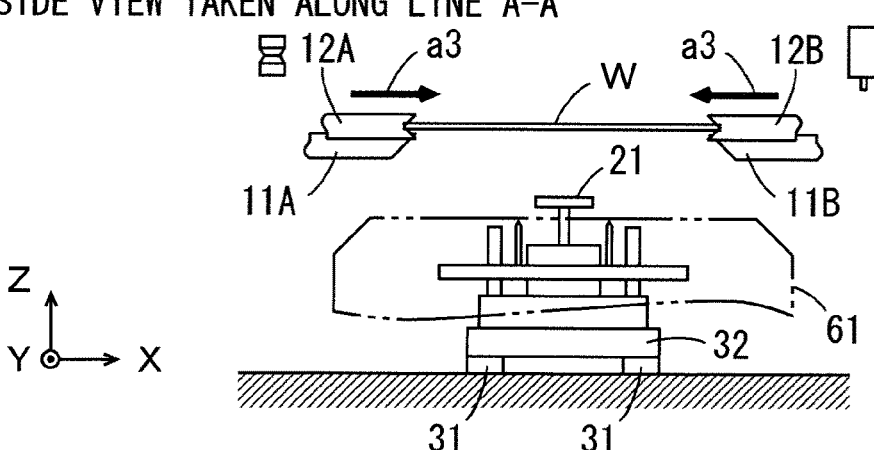
SIDE VIEW TAKEN ALONG LINE B-B
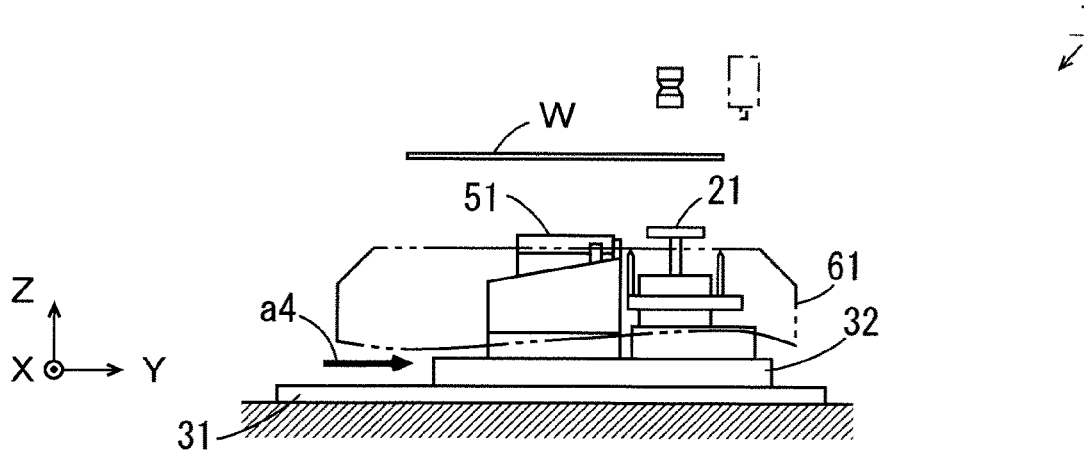

F I G. 7
PLAN VIEW
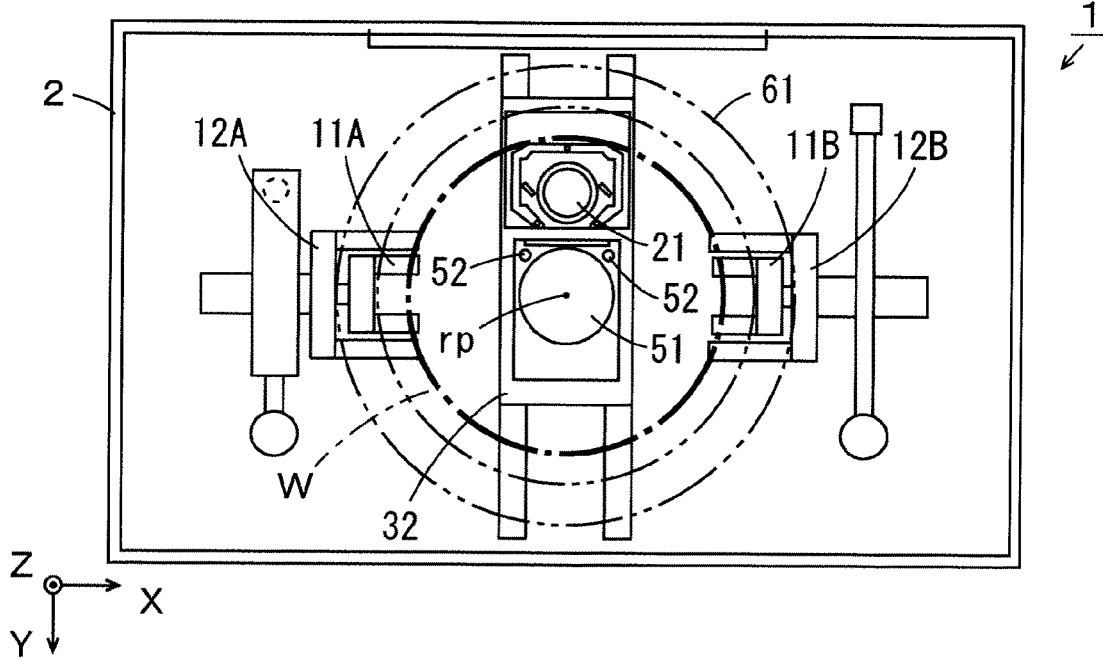
SIDE VIEW TAKEN ALONG LINE A-A
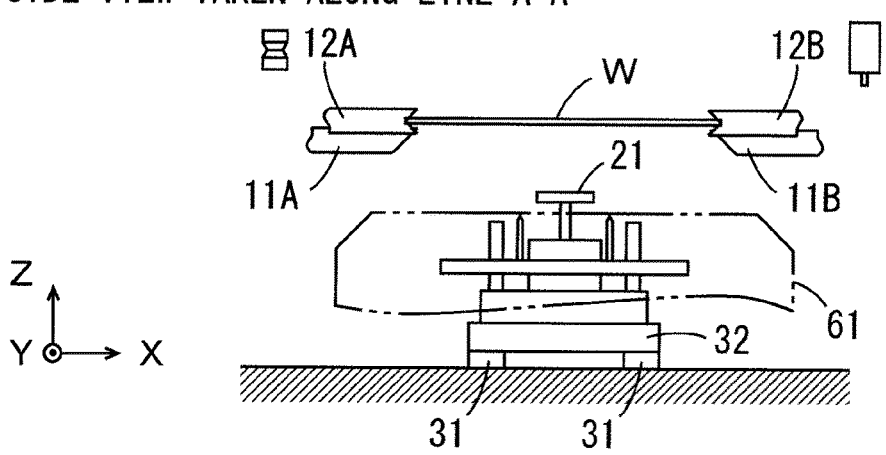
SIDE VIEW TAKEN ALONG LINE B-B
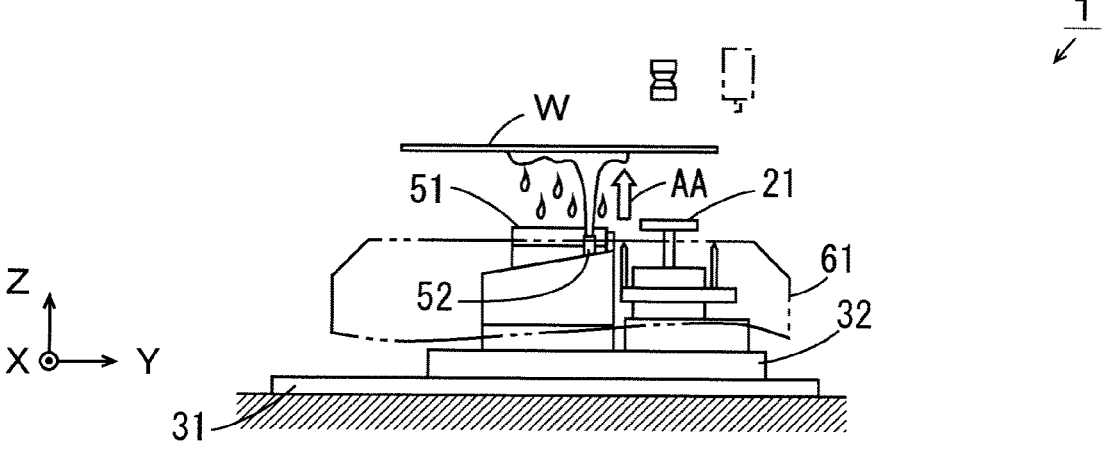

F I G. 8
PLAN VIEW
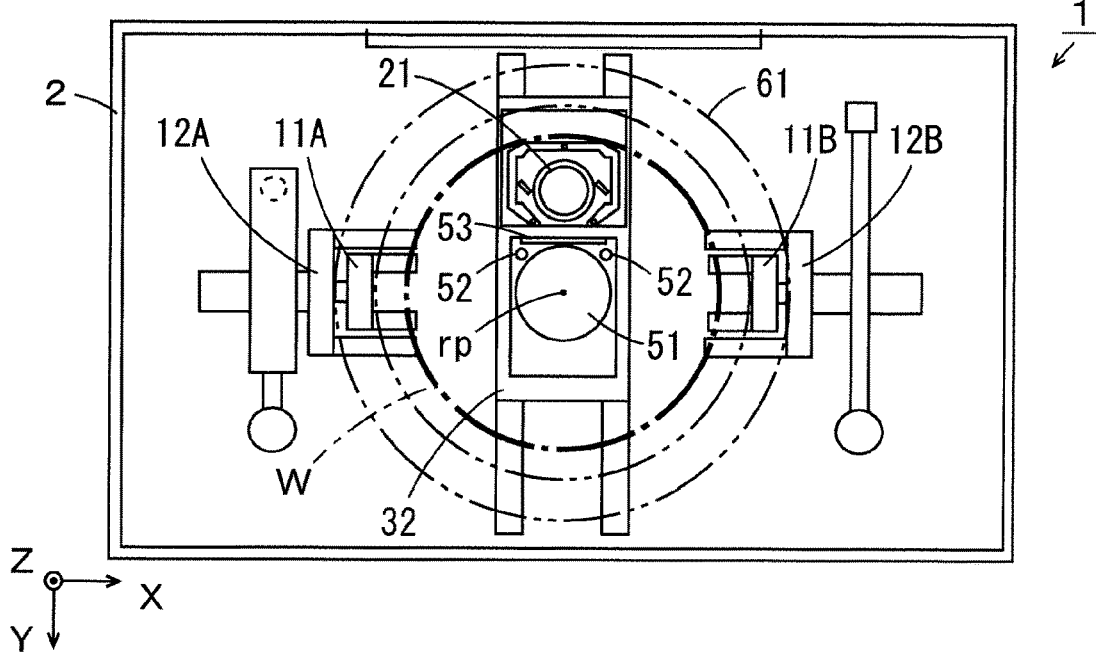
SIDE VIEW TAKEN ALONG LINE A-A
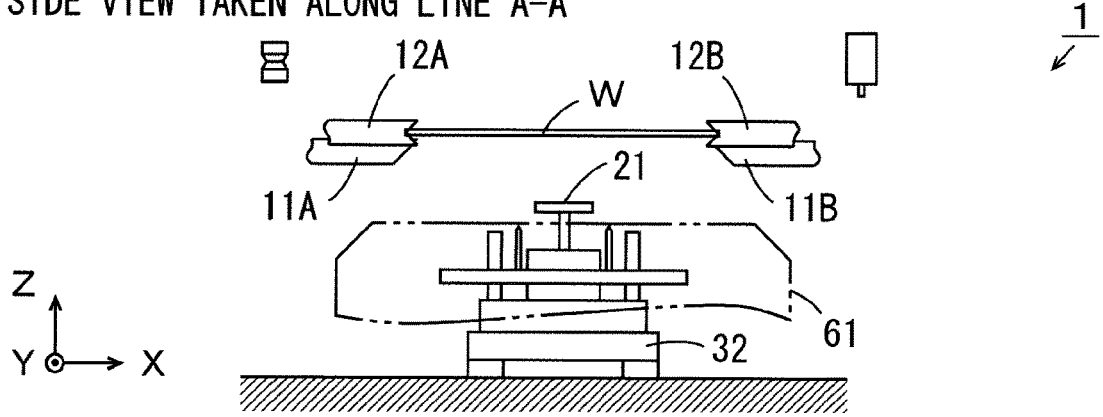
SIDE VIEW TAKEN ALONG LINE B-B
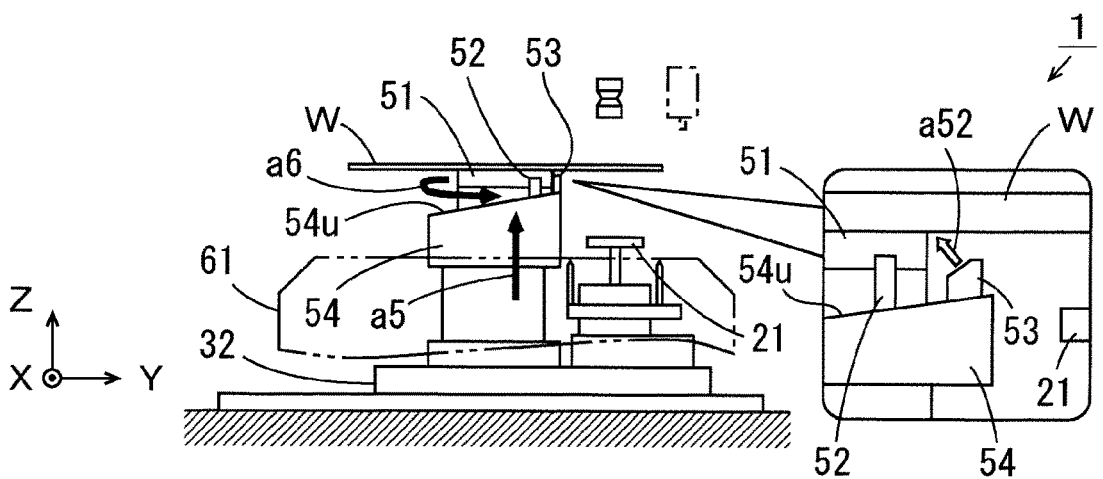

FIG. 9
PLAN VIEW
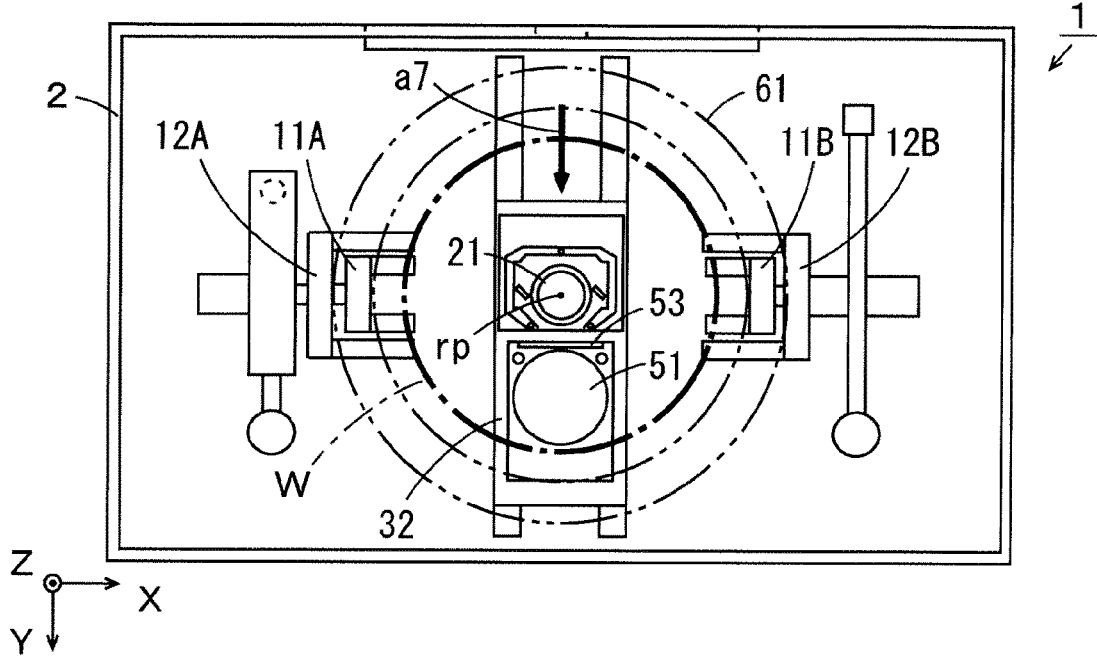
SIDE VIEW TAKEN ALONG LINE A-A
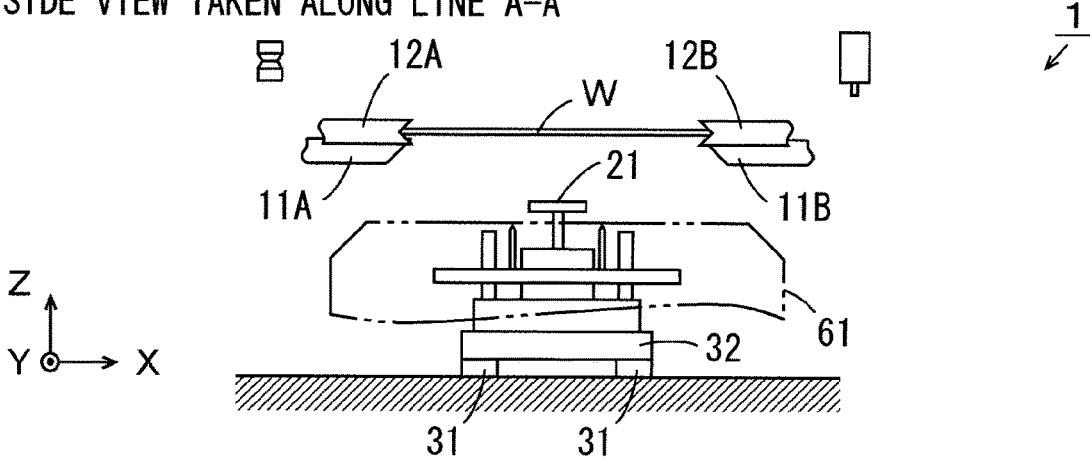
SIDE VIEW TAKEN ALONG LINE B-B
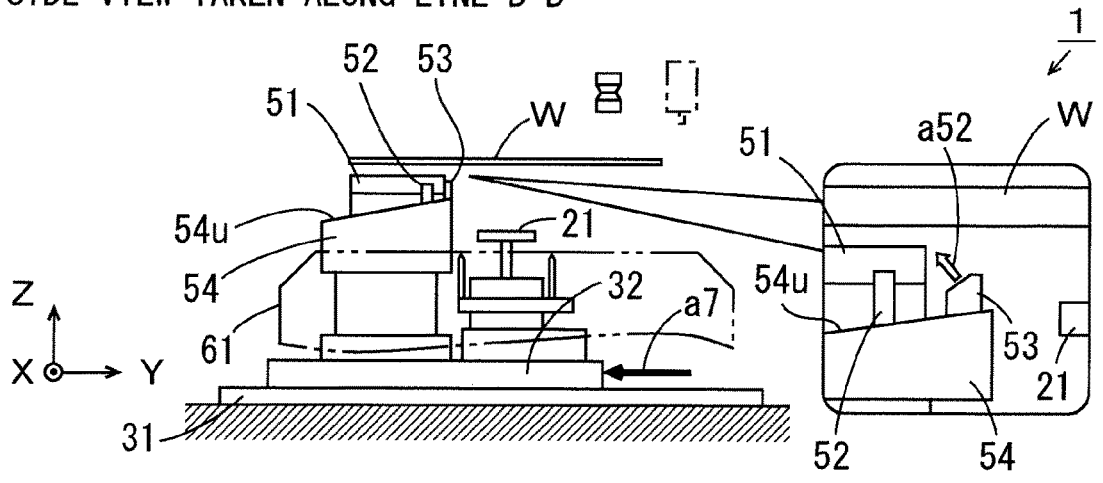

FIG. 10
PLAN VIEW
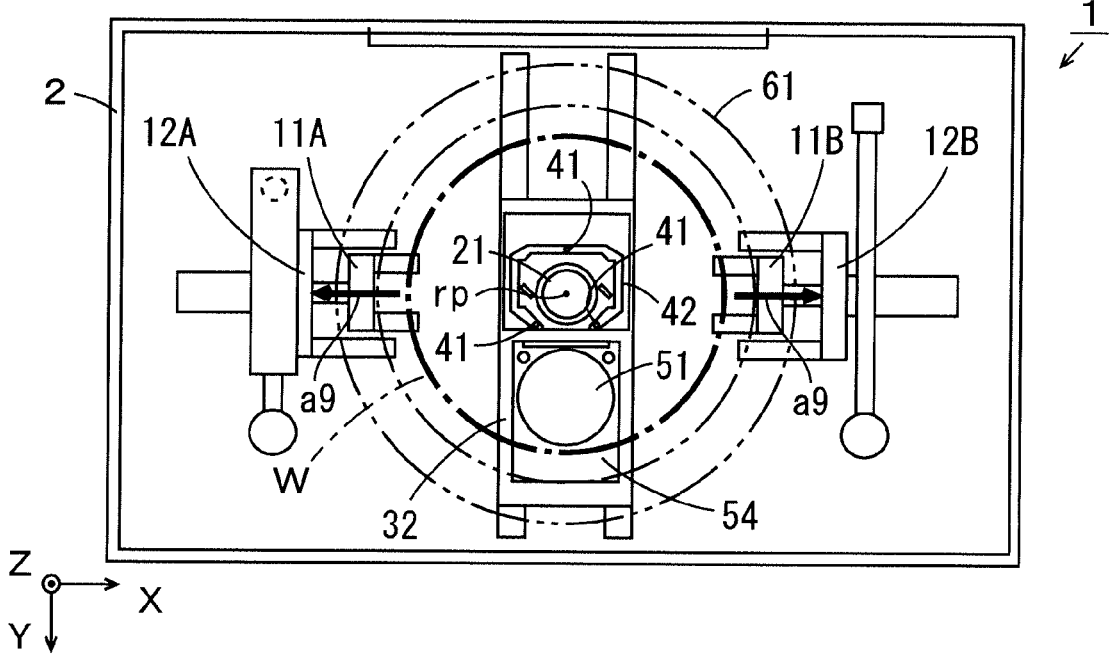
SIDE VIEW TAKEN ALONG LINE A-A
SIDE VIEW TAKEN ALONG LINE B-B
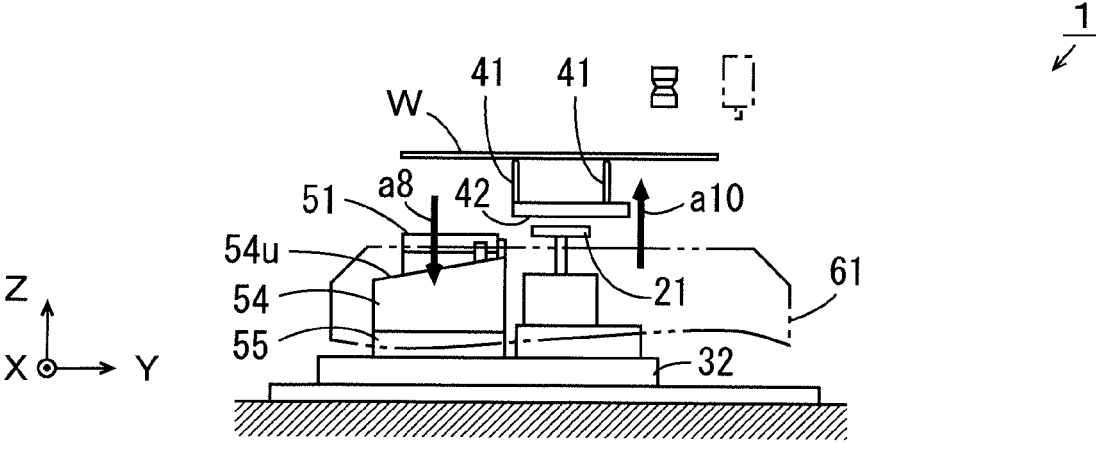

F I G.  1 1
PLAN VIEW
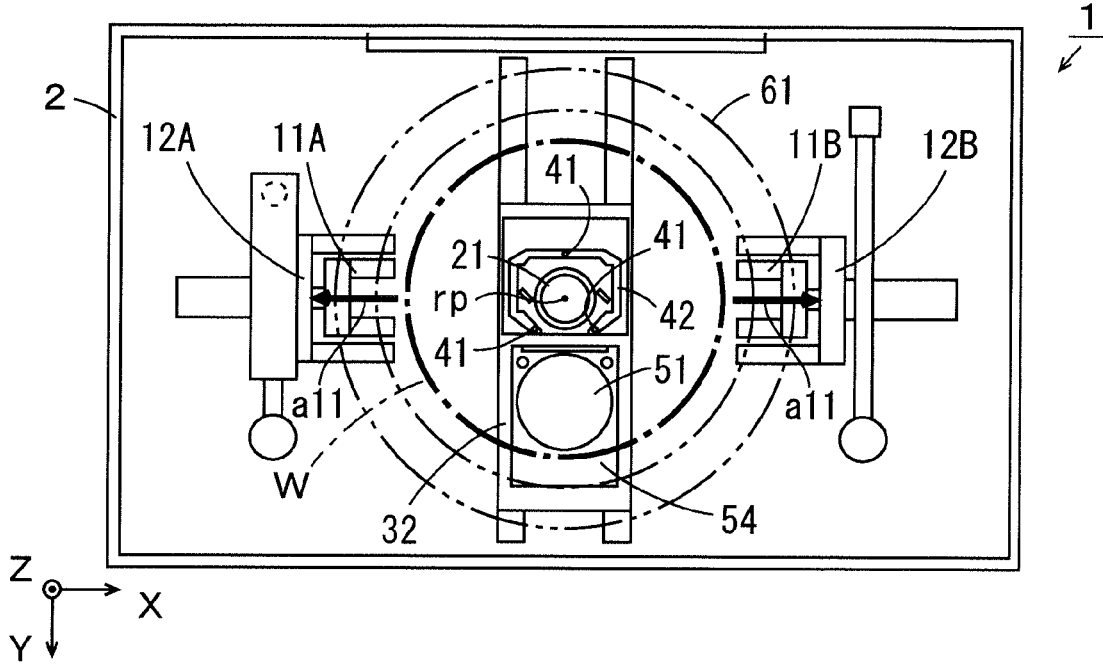
SIDE VIEW TAKEN ALONG LINE A-A
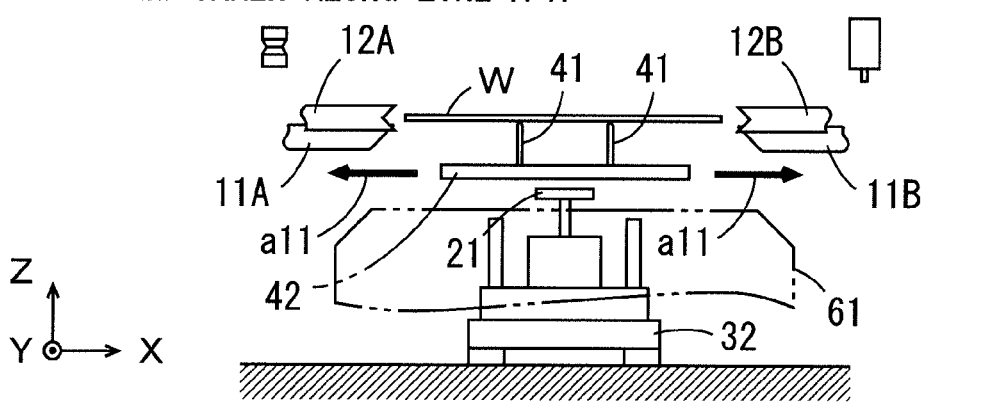
SIDE VIEW TAKEN ALONG LINE B-B
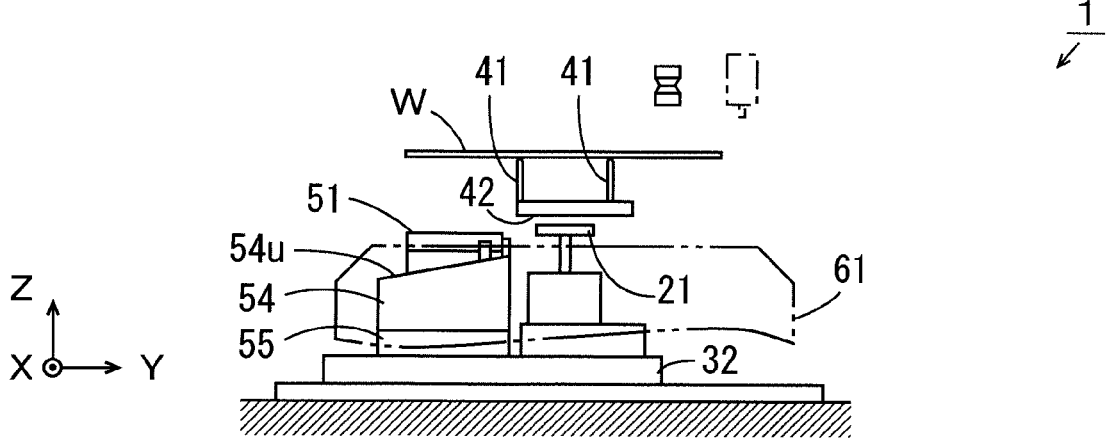

FIG. 12
PLAN VIEW
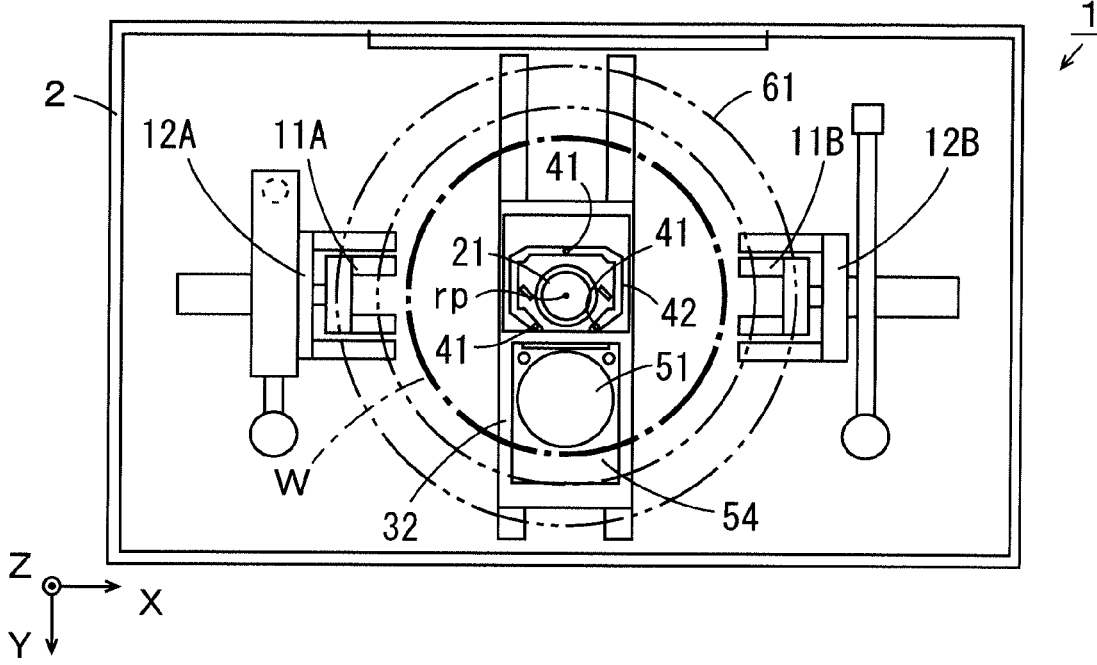
SIDE VIEW TAKEN ALONG LINE A-A
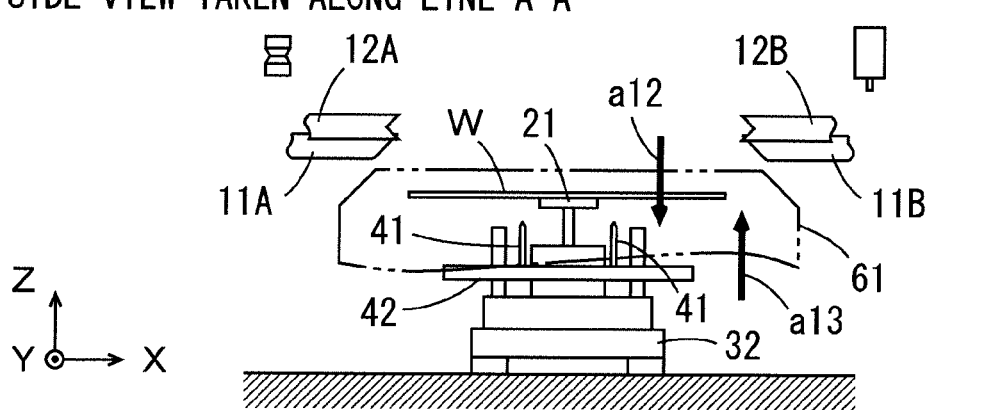
SIDE VIEW TAKEN ALONG LINE B-B
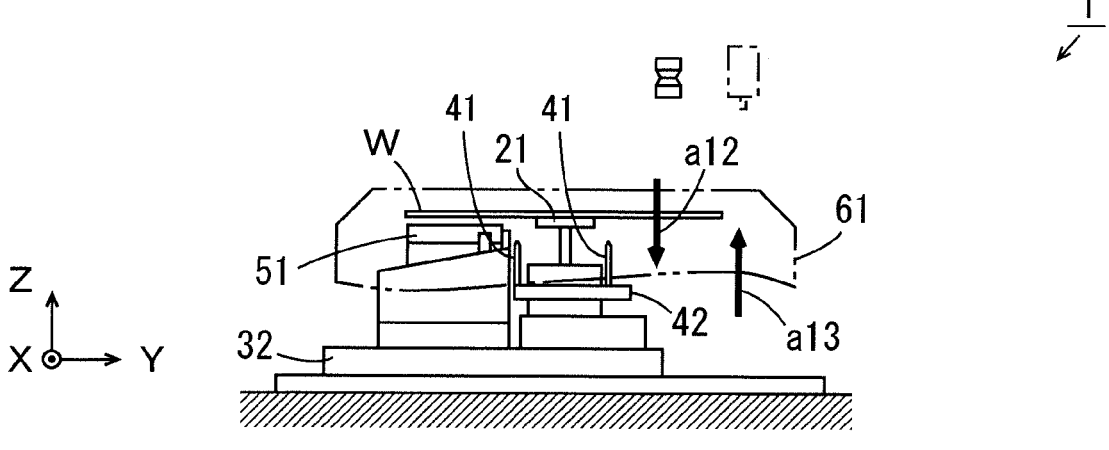

FIG. 13
PLAN VIEW
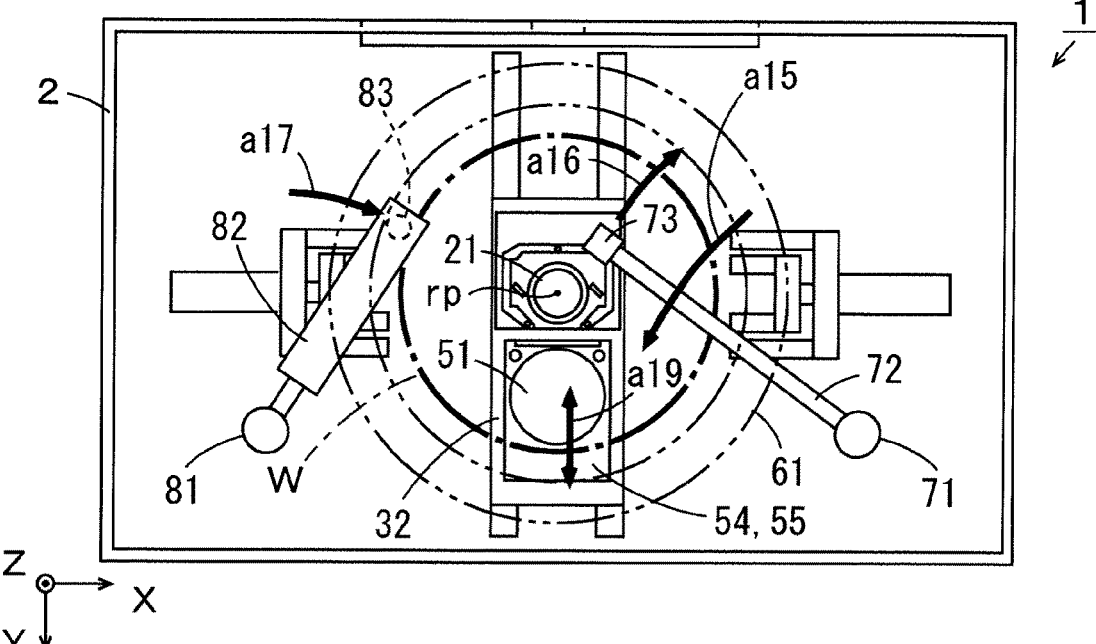
SIDE VIEW TAKEN ALONG LINE A-A
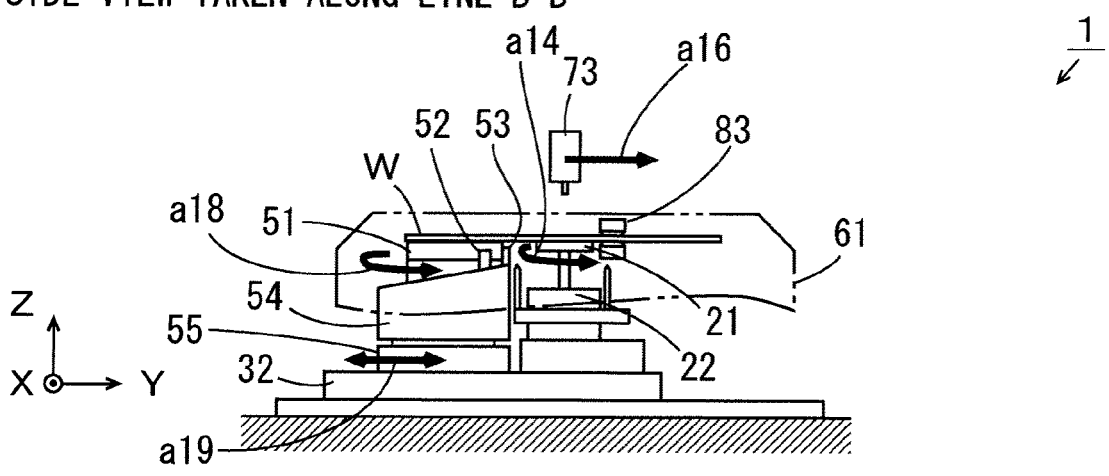
SIDE VIEW TAKEN ALONG LINE B-B FIG. 14
PLAN VIEW
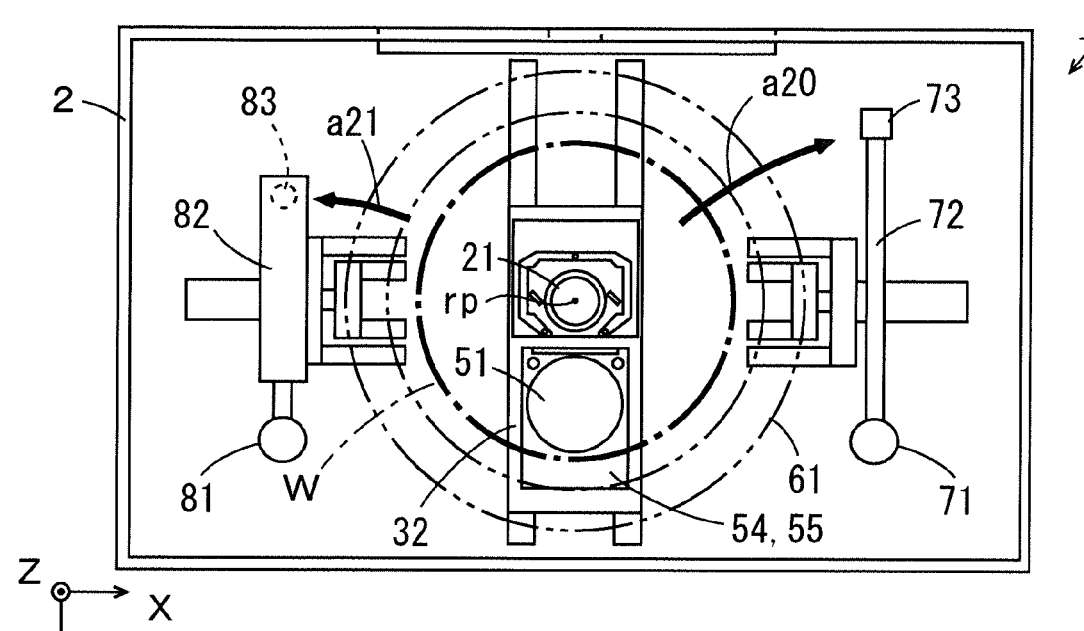
SIDE VIEW TAKEN ALONG LINE A-A
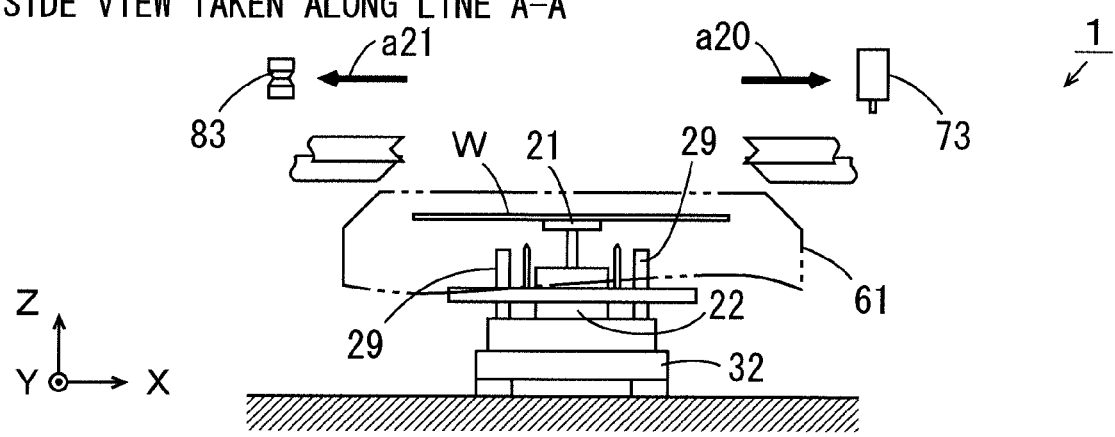
SIDE VIEW TAKEN ALONG LINE B-B
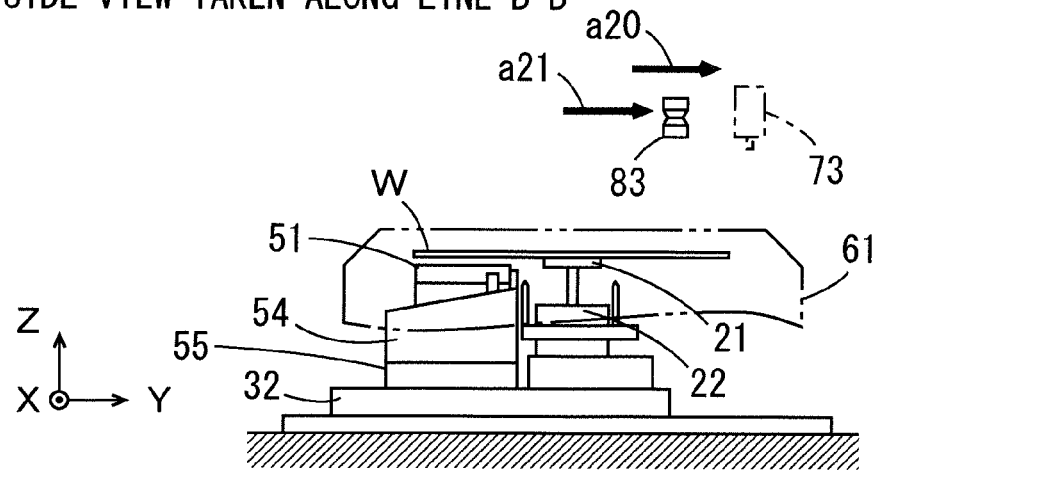

FIG. 15
PLAN VIEW
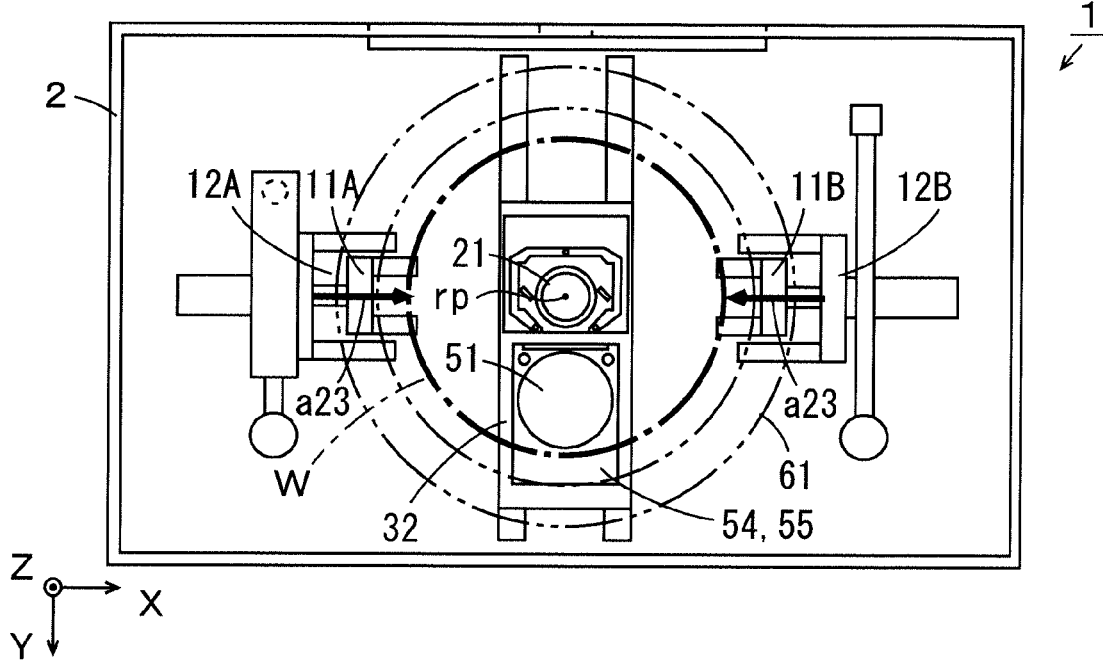
SIDE VIEW TAKEN ALONG LINE A-A
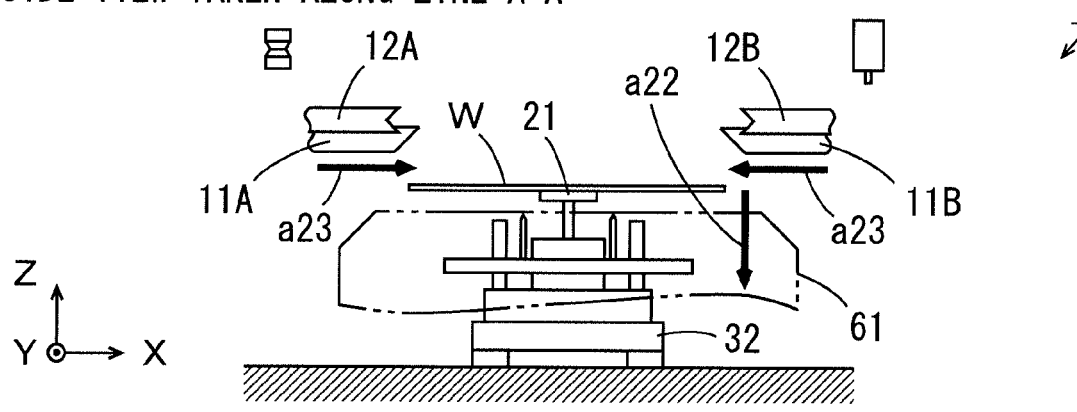
SIDE VIEW TAKEN ALONG LINE B-B
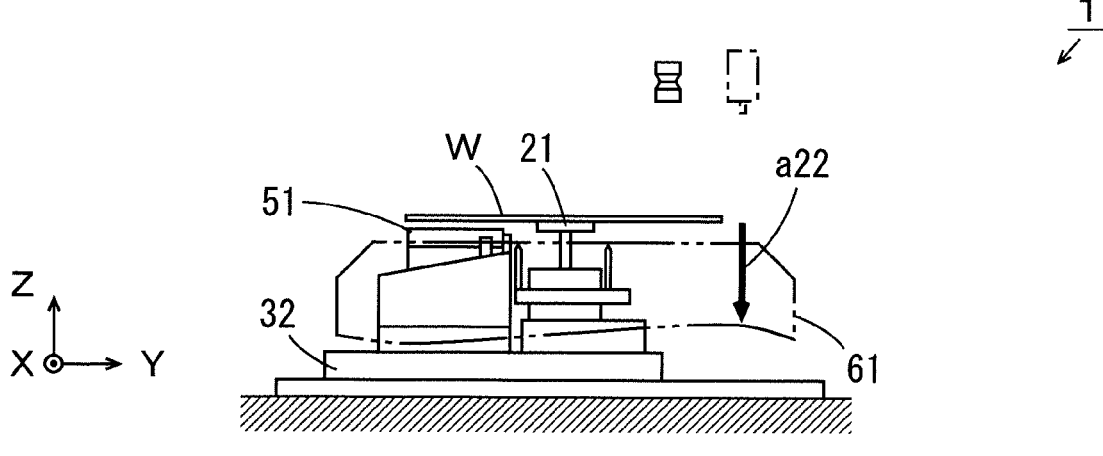

FIG. 16
PLAN VIEW
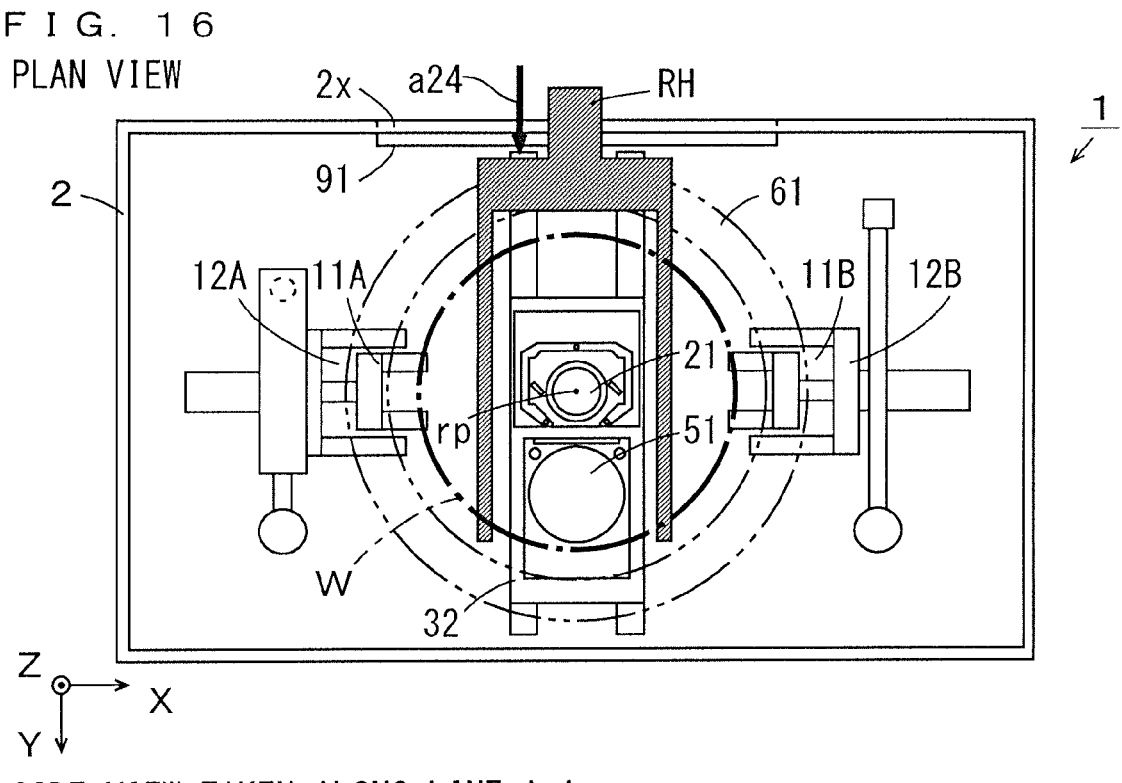
SIDE VIEW TAKEN ALONG LINE A-A
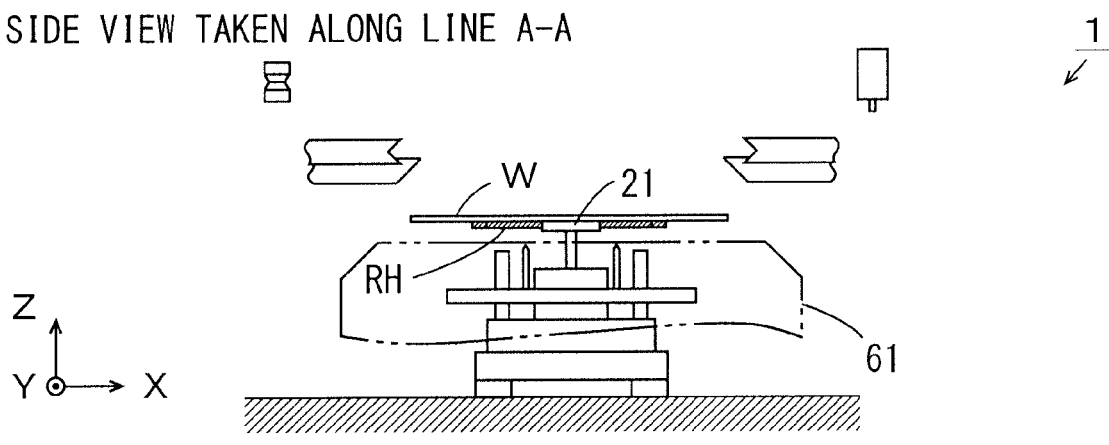
SIDE VIEW TAKEN ALONG LINE B-B
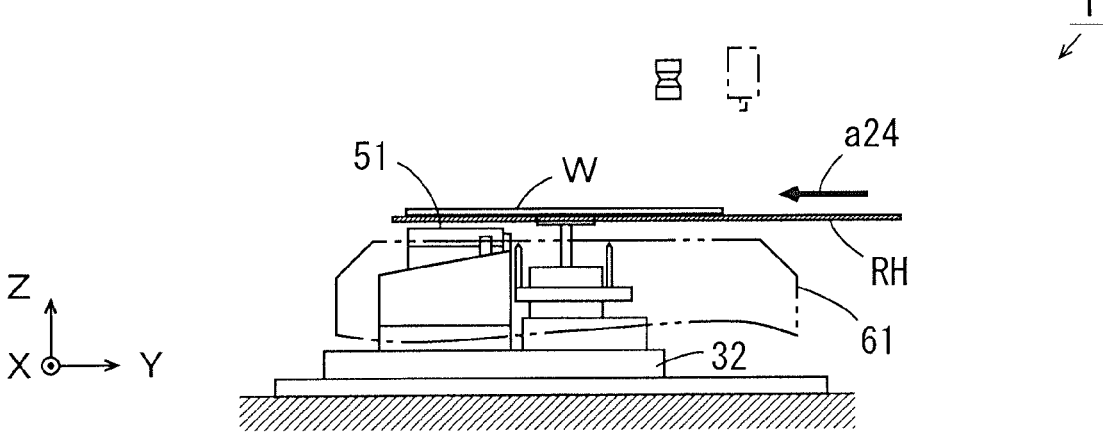

F I G. 1 7
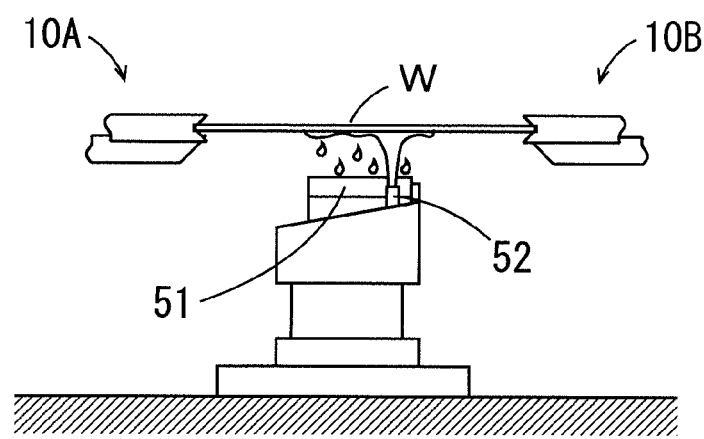
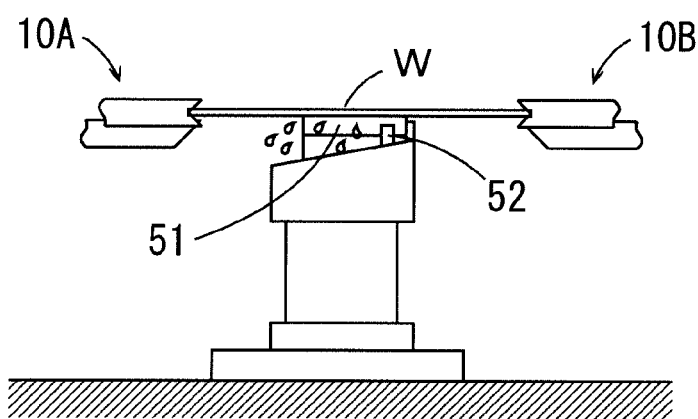
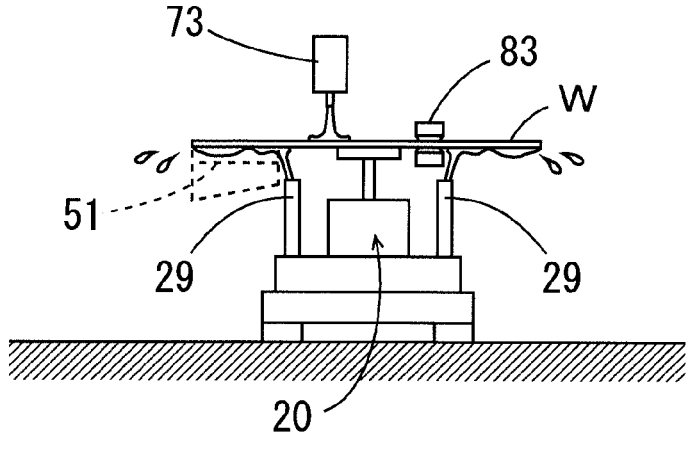

300

51

F I G . 2 0
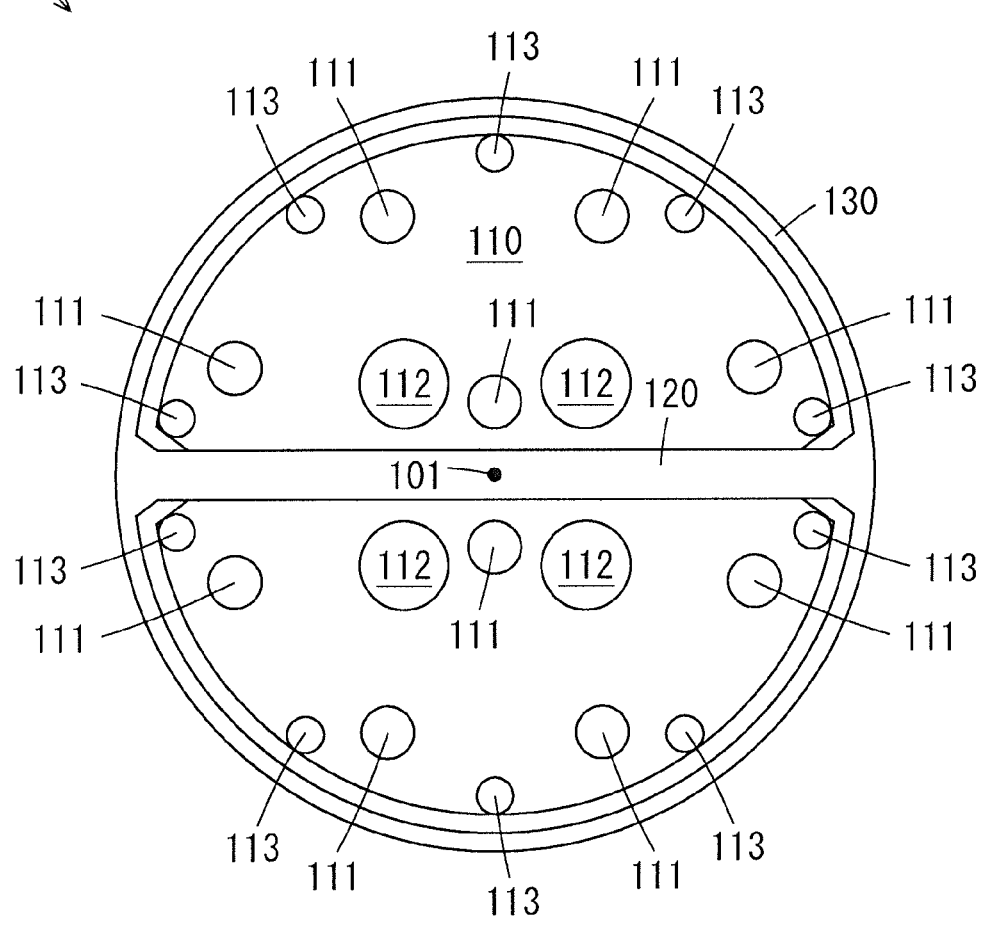
F I G . 2 1
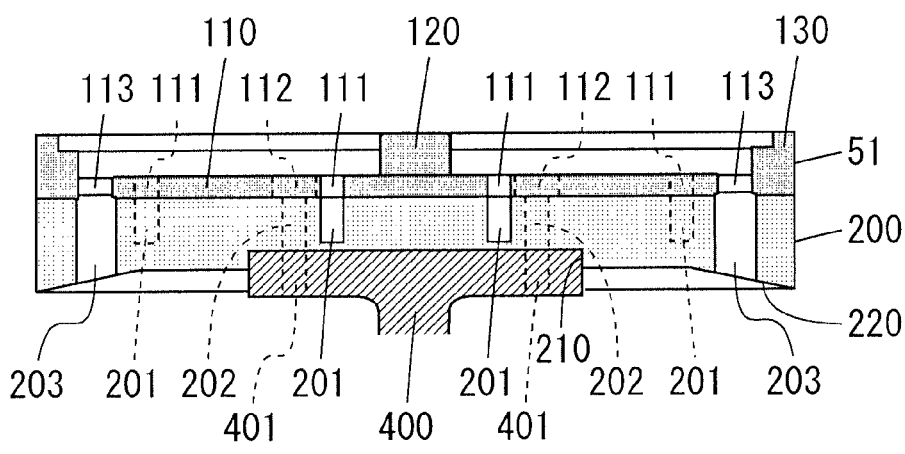

SUBSTRATE CLEANING DEVICE AND SUBSTRATE CLEANING METHOD

CROSS-REFERENCE TO RELATED APPLICATIONS

The present application is a 35 U.S.C. §§ 371 national stage application of International Application No. PCT/JP2022/025407, filed Jun. 24, 2022, which claims priority to Japanese Patent Application No. 2021-123744, filed Jul. 28, 2021, the contents of which are incorporated herein by reference.

TECHNICAL FIELD

The present invention relates to a substrate cleaning device and a substrate cleaning method for cleaning an upper surface and a lower surface of a substrate.

BACKGROUND ART

A substrate processing apparatus is used to perform various processes on various substrates such as a substrate for an FPD (Flat Panel Display) that is used for a liquid crystal display device, an organic EL (Electro Luminescence) display device or the like, a semiconductor substrate, a substrate for an optical disc, a substrate for a magnetic disc, a substrate for a magneto-optical disc, a substrate for a photomask, a ceramic substrate or a substrate for a solar cell. A substrate cleaning device is used to clean a substrate.

For example, a cleaning device (substrate cleaning device) described in Patent Document 1 includes a main-surface scrubber, a back-surface scrubber, and a main-back surface inversion unit. The main-back surface inversion unit switches a substrate having a main surface and a back surface between a state in which the main surface (device surface) faces upwardly and a state in which the main surface faces downwardly.

The substrate the main surface of which is directed upwardly by the main-back surface inversion unit is carried into the main-surface scrubber. In the main-surface scrubber, the substrate is rotated in a horizontal attitude, a rinse liquid (cleaning liquid) is supplied to the main surface of the substrate facing upwardly, and a cleaning brush is pressed against the main surface of the substrate. Thus, the main surface of the substrate is cleaned.

On the other hand, the substrate the back surface of which is directed upwardly by the main-back surface inversion unit is carried into the back-surface scrubber. In the back-surface scrubber, the substrate is rotated in a horizontal attitude, a rinse liquid (cleaning liquid) is supplied to the back surface of the substrate facing upwardly, and the cleaning brush is pressed against the back surface of the substrate. Thus, the back surface of the substrate is cleaned.

[Patent Document 1] JP 2003-229398 A

SUMMARY OF INVENTION

Technical Problem

As described above, in a case in which one of the main surface and the back surface of the rotating substrate is cleaned while the cleaning liquid is supplied to the one surface, the cleaning liquid flowing on the one surface may flow from the outer peripheral end of the substrate to the other surface of the substrate. In this case, the peripheral portion of the other surface of the substrate may be contaminated. As such, in a case in which one surface of the rotating substrate is cleaned while the cleaning liquid is supplied to the one surface, the cleaning liquid is supplied to the other surface of the substrate (so called back rinse) in order to prevent the cleaning liquid from flowing from the one surface to the other surface of the substrate.

However, when back rinse is performed during cleaning of each of one surface and the other surface of the substrate, a large amount of a cleaning liquid is required to clean one substrate. In this case, the cost required for the cleaning process increases depending on the type of a cleaning liquid to be used. Further, a large amount of waste liquid needs to be detoxified.

An object of the present invention is to provide a substrate cleaning device and a substrate cleaning method with which an amount of a cleaning liquid required for cleaning of an upper surface and a lower surface of a substrate can be reduced.

Solution to Problem (1) A substrate cleaning device according to one aspect of the present invention that cleans an upper surface and a lower surface of a substrate with use of a cleaning liquid, includes a first substrate holder that holds the substrate in a horizontal attitude while not rotating the substrate by abutting against a plurality of portions of an outer peripheral end of the substrate, a cleaning brush configured to come into contact with the lower surface of the substrate, a brush driver configured to press the cleaning brush against the lower surface of the substrate held by the first substrate holder and move the cleaning brush relative to the substrate held by the first substrate holder, and a controller, wherein the controller controls the first substrate holder and the brush driver such that the cleaning brush wetted with a cleaning liquid moves on a lower-surface center region of the substrate while the cleaning brush is pressed against the lower-surface center region of the substrate with the cleaning liquid not supplied to the substrate.

In the substrate cleaning device, with the cleaning liquid not supplied to the substrate, the lower-surface center region of the substrate held by the first substrate holder is cleaned by the cleaning liquid wetted with the cleaning liquid. At this time, the substrate is not rotated. Therefore, during cleaning of the lower-surface center region of the substrate, the cleaning liquid hardly reaches the outer peripheral end of the substrate. That is, the cleaning liquid does not flow from the lower surface of the substrate to the upper surface of the substrate through the outer peripheral end of the substrate. Therefore, it is not necessary to supply the cleaning liquid to the upper surface of the substrate in order to protect the upper-surface peripheral portion of the substrate. As a result, it is possible to reduce an amount of the cleaning liquid required for cleaning of the upper surface and the lower surface of the substrate.

(2) The substrate cleaning device may further include a first lower-surface liquid supplier that supplies the cleaning liquid to the lower-surface center region of the substrate held by the first substrate holder, wherein the controller may control the brush driver and the first lower-surface liquid supplier such that the cleaning liquid is supplied to the lower-surface center region of the substrate held by the first substrate holder with the cleaning brush located below the lower-surface center region before the cleaning brush is pressed against the lower-surface center region of the substrate.

In this case, before the cleaning brush is pressed against the lower-surface center region of the substrate, the cleaning liquid is supplied to the lower-surface center region of the substrate. Further, at this time, the cleaning brush is located below the lower-surface center region of the substrate. Therefore, the cleaning liquid supplied to the lower-surface center region of the substrate falls from the lower surface of the substrate onto the cleaning brush. Thus, the cleaning brush and the lower-surface center region of the substrate are wetted. As a result, the lower-surface center region of the substrate is smoothly cleaned by the cleaning brush.

(3) The substrate cleaning device may further include a second substrate holder that rotates the substrate about an axis extending in an up-and-down direction while holding the substrate in a horizontal attitude by sucking the lower-surface center region of the substrate, and an upper-surface liquid supplier that supplies the cleaning liquid to the upper surface of the substrate held by the second substrate holder, and a second lower-surface liquid supplier that supplies the cleaning liquid to a lower-surface outer region surrounding the lower-surface center region of the substrate held by the second substrate holder, wherein the brush driver may be configured to further press the cleaning brush against the lower-surface outer region of the substrate held by the second substrate holder, and the controller may control the second substrate holder, the upper-surface liquid supplier, the second lower-surface liquid supplier and the brush driver such that the cleaning brush is pressed against the lower-surface outer region of the substrate while the cleaning liquid is supplied to the upper surface of the substrate rotated by the second substrate holder and the cleaning liquid is supplied to the lower-surface outer region of the substrate.

In this case, the lower-surface outer region of the substrate is cleaned while the upper surface of the rotating substrate is cleaned. At this time, the cleaning liquid supplied to the lower-surface outer region of the substrate functions as back rinse that prevents the cleaning liquid supplied to the upper surface of the substrate from flowing to the lower surface of the substrate as well as functioning as the cleaning liquid for cleaning the lower-surface outer region of the substrate. Thus, it is not necessary to separately perform the supply of the cleaning liquid for cleaning the lower-surface outer region of the substrate and the back rinse for preventing the cleaning liquid supplied to the upper surface of the substrate from flowing to the lower surface of the substrate W. As a result, the consumption of the cleaning liquid can be reduced.

(4) The cleaning brush may be a lower-surface brush used to clean the lower surface of the substrate, and the lower-surface brush may include a base portion having a flat surface directed upwardly, and a first cleaning portion provided at the flat surface of the base portion so as to project upwardly from the flat surface of the base portion and extend along an outer edge of the base portion.

In this case, before cleaning of the lower-surface center region of the substrate, the cleaning liquid can be stored in the region inside of the first cleaning portion of the lower-surface brush. Thus, even with the cleaning liquid not supplied to the lower surface of the substrate, the lower-surface center region of the substrate is smoothly cleaned with the cleaning liquid stored inside of the first cleaning portion of the lower-surface brush.

(5) The lower-surface brush may further include a second cleaning portion provided at the flat surface of the base portion so as to project upwardly from the flat surface of the base portion and extend in one direction through a geometric center of the base portion in plan view.

In this case, the contact area of the lower-surface brush with respect to the substrate increases as compared with the configuration in which only the first cleaning portion is formed on the base portion. Thus, it is possible to obtain a higher cleaning power for the lower surface of the substrate.

(6) A substrate cleaning method according to another aspect of the present invention of cleaning an upper surface and a lower surface of a substrate with use of a cleaning liquid, includes the steps of holding the substrate in a horizontal attitude while not rotating the substrate by using a first substrate holder that abuts against a plurality of portions of an outer peripheral end of the substrate, and pressing a cleaning brush configured to come into contact with the lower surface of the substrate against the lower surface of the substrate held by the first substrate holder and moving the cleaning brush relative to the substrate held by the first substrate holder, wherein the step of pressing the cleaning brush against the lower surface of the substrate and moving the cleaning brush relative to the substrate includes moving the cleaning brush wetted with the cleaning liquid on a lower-surface center region of the substrate while pressing the cleaning brush against the lower-surface center region of the substrate with the cleaning liquid not supplied to the substrate.

With the substrate cleaning method, with the cleaning liquid not supplied to the substrate, the lower-surface center region of the substrate held by the first substrate holder is cleaned by the cleaning liquid wetted with the cleaning liquid. At this time, the substrate is not rotated. Therefore, during cleaning of the lower-surface center region of the substrate, the cleaning liquid hardly reaches the outer peripheral end of the substrate. That is, the cleaning liquid does not flow from the lower surface of the substrate to the upper surface of the substrate. Therefore, it is not necessary to supply the cleaning liquid to the upper surface of the substrate in order to protect the upper-surface peripheral portion of the substrate. As a result, it is possible to reduce an amount of the cleaning liquid required for cleaning of the upper surface and the lower surface of the substrate.

(7) The substrate cleaning method may further include the step of supplying the cleaning liquid to the lower-surface center region of the substrate held by the first substrate holder with the cleaning brush located below the lower-surface center region before the cleaning brush is pressed against the lower-surface center region of the substrate.

In this case, before the cleaning brush is pressed against the lower-surface center region of the substrate, the cleaning liquid is supplied to the lower-surface center region of the substrate. Further, at this time, the cleaning brush is located below the lower-surface center region of the substrate. Therefore, the cleaning liquid supplied to the lower-surface center region of the substrate falls from the lower surface of the substrate onto the cleaning brush. Thus, the cleaning brush and the lower-surface center region of the substrate are wetted. As a result, the lower-surface center region of the substrate is smoothly cleaned by the cleaning brush.

(8) The substrate cleaning method may further include the steps of rotating the substrate about an axis extending in an up-and-down direction while holding the substrate in a horizontal attitude by using a second substrate holder that sucks the lower-surface center region of the substrate, supplying the cleaning liquid to the upper surface of the substrate held and rotated by the substrate holder, and supplying the cleaning liquid to a lower-surface outer region surrounding the lower-surface center region of the substrate held and rotated by the second substrate holder with the cleaning liquid supplied to the upper surface of the substrate, wherein the step of pressing the cleaning brush against the lower-surface of the substrate and moving the cleaning brush relative to the substrate may include moving the cleaning brush on the lower-surface outer region of the substrate while pressing the cleaning brush against the lower-surface outer region of the substrate with cleaning liquid supplied to the upper surface of the substrate rotated by the second substrate holder and with the cleaning liquid supplied to the lower-surface outer region of the substrate.

In this case, the lower-surface outer region of the substrate is cleaned while the upper surface of the rotating substrate is cleaned. At this time, the cleaning liquid supplied to the lower-surface outer region of the substrate functions as back rinse that prevents the cleaning liquid supplied to the upper surface of the substrate from flowing to the lower surface of the substrate as well as functioning as the cleaning liquid for cleaning the lower-surface outer region of the substrate. Thus, it is not necessary to separately perform the supply of the cleaning liquid for cleaning the lower-surface outer region of the substrate and the back rinse for preventing the cleaning liquid supplied to the upper surface of the substrate from flowing to the lower surface of the substrate W. As a result, the consumption of the cleaning liquid can be reduced.

(9) The cleaning brush may be a lower-surface brush used to clean the lower surface of the substrate, and the lower-surface brush may include a base portion having a flat surface directed upwardly, and a first cleaning portion provided at the flat surface of the base portion so as to project upwardly from the flat surface of the base portion and extend along an outer edge of the base portion.

In this case, before cleaning of the lower-surface center region of the substrate, the cleaning liquid can be stored in the region inside of the first cleaning portion of the lower-surface brush. Thus, even with the cleaning liquid not supplied to the lower surface of the substrate, the lower-surface center region of the substrate is smoothly cleaned with the cleaning liquid stored inside of the first cleaning portion of the lower-surface brush.

(10) The lower-surface brush may further include a second cleaning portion provided at the flat surface of the base portion so as to project upwardly from the flat surface of the base portion and extend in one direction through a geometric center of the base portion in plan view.

In this case, the contact area of the lower-surface brush with respect to the substrate increases as compared with the configuration in which only the first cleaning portion is formed on the base portion. Thus, it is possible to obtain a higher cleaning power for the lower surface of the substrate.

Advantageous Effects of Invention

With the present invention, it is possible to reduce an amount of the cleaning liquid required for cleaning of the upper surface and the lower surface of the substrate.

BRIEF DESCRIPTION OF THE DRAWINGS

FIG. 1 is a schematic plan view of a substrate cleaning device according to one embodiment of the present invention.

FIG. 2 is an external perspective view showing the inner configuration of the substrate cleaning device of FIG. 1.

FIG. 3 is a block diagram showing the configuration of a control system of the substrate cleaning device of FIG. 1.

FIG. 4 is a schematic diagram for explaining the schematic operation of the substrate cleaning device of FIG. 1.

FIG. 5 is a schematic diagram for explaining the schematic operation of the substrate cleaning device of FIG. 1.

FIG. 6 is a schematic diagram for explaining the schematic operation of the substrate cleaning device of FIG. 1.

FIG. 7 is a schematic diagram for explaining the schematic operation of the substrate cleaning device of FIG. 1.

FIG. 8 is a schematic diagram for explaining the schematic operation of the substrate cleaning device of FIG. 1.

FIG. 9 is a schematic diagram for explaining the schematic operation of the substrate cleaning device of FIG. 1.

FIG. 10 is a schematic diagram for explaining the schematic operation of the substrate cleaning device of FIG. 1.

FIG. 11 is a schematic diagram for explaining the schematic operation of the substrate cleaning device of FIG. 1.

FIG. 12 is a schematic diagram for explaining the schematic operation of the substrate cleaning device of FIG. 1.

FIG. 13 is a schematic diagram for explaining the schematic operation of the substrate cleaning device of FIG. 1.

FIG. 14 is a schematic diagram for explaining the schematic operation of the substrate cleaning device of FIG. 1.

FIG. 15 is a schematic diagram for explaining the schematic operation of the substrate cleaning device of FIG. 1.

FIG. 16 is a schematic diagram for explaining the schematic operation of the substrate cleaning device of FIG. 1.

FIG. 17 is a diagram for explaining the main effects of the present invention obtained by a series of operations of the substrate cleaning device 1 shown in FIGS. 4 to 16.

FIG. 20 is a plan view of the lower-surface brush of FIG. 18.

FIG. 21 is a longitudinal cross sectional view of the brush unit of FIG. 18.

DESCRIPTION OF EMBODIMENTS

Figure 18:
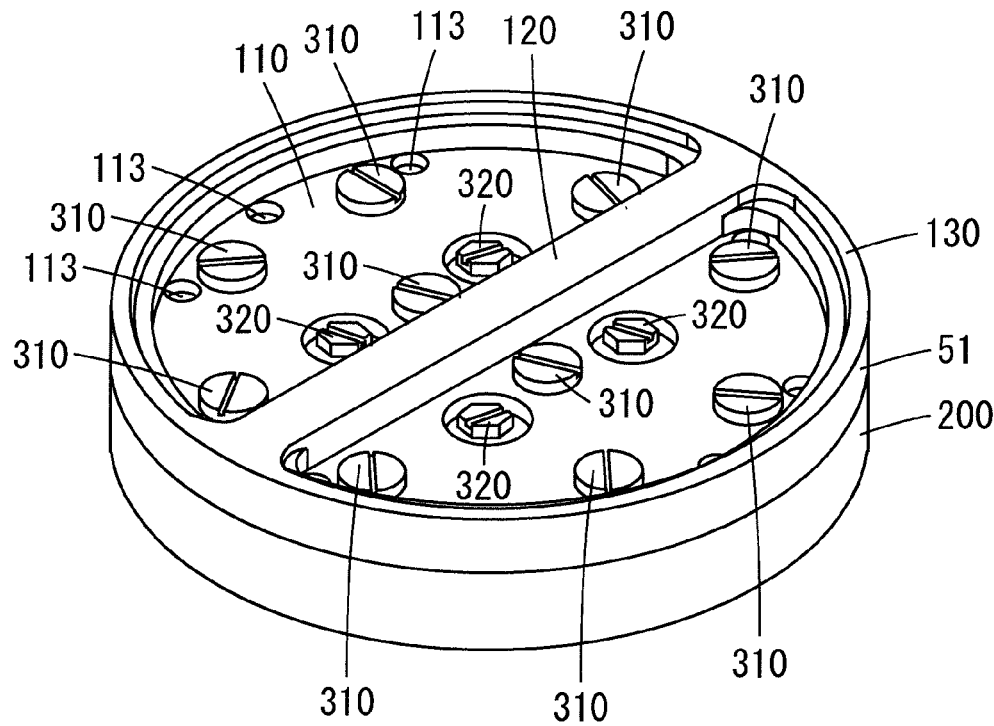
FIG. 18 is an external perspective view showing the example of the preferred configuration of the brush unit.

A substrate cleaning device and a substrate cleaning method according to embodiments of the present invention will be described below with reference to the drawings. In the following description, a substrate refers to a semiconductor substrate, a substrate for an FPD (Flat Panel Display) such as a liquid crystal display device or an organic EL (Electro Luminescence) display device, a substrate for an optical disc, a substrate for a magnetic disc, a substrate for a magneto-optical disc, a substrate for a photomask, a ceramic substrate, a substrate for a solar battery, or the like. Further, as for a substrate to be used in the present embodiment, at least part of the substrate has a circular outer periphery. For example, the outer periphery except for a notch for positioning is circular.

1. Configuration of Substrate Cleaning Device

FIG. 1 is a schematic plan view of the substrate cleaning device according to one embodiment of the present invention. FIG. 2 is an external perspective view showing the inner configuration of the substrate cleaning device 1 of FIG. 1. In the substrate cleaning device 1 according to the present embodiment, X, Y and Z directions orthogonal to one another are defined for the clarity of a positional relationship. In FIG. 1 and the subsequent drawings, the X, Y and Z directions are suitably indicated by arrows. The X and Y directions are orthogonal to each other within a horizontal plane, and the Z direction corresponds to a vertical direction.

As shown in FIG. 1, the substrate cleaning device 1 includes upper holding devices 10A, 10B, a lower holding device 20, a base device 30, a receiving-transferring device 40, a lower-surface cleaning device 50, a cup device 60, an upper-surface cleaning device 70, an end-portion cleaning device 80 and an opening-closing device 90. These constituent elements are provided in a unit casing 2. In FIG. 2, the unit casing 2 is indicated by the dotted lines.

The unit casing 2 has a rectangular bottom surface portion 2a, and four sidewall portions 2b, 2c, 2d, 2e extending upwardly from the four sides of the bottom surface portion 2a. The sidewall portions 2b, 2c are opposite to each other, and the sidewall portions 2d, 2e are opposite to each other. A rectangular opening is formed in the center portion of the sidewall portion 2b. This opening is an inlet-outlet port 2x for a substrate W and is used when the substrate W is carried into and carried out from the unit casing 2. In FIG. 2, the inlet-outlet port 2x is indicated by the thick dotted lines. In the following description, a direction directed outwardly of the unit casing 2 in the Y direction from the inside of the unit casing 2 through the inlet-outlet port 2x (the direction directed from the sidewall portion 2c toward the sidewall portion 2b) is referred to as forward, and its opposite direction (the direction directed from the sidewall portion 2b toward the sidewall portion 2c) is referred to as rearward.

The opening-closing device 90 is provided in a portion in which the inlet-outlet port 2x is formed and its vicinal region in the sidewall portion 2b. The opening-closing device 90 includes a shutter 91 that is configured to be capable of opening and closing the inlet-outlet port 2x and a shutter driver 92 that drives the shutter 91. In FIG. 2, the shutter 91 is indicated by the thick two-dots and dash lines. The shutter driver 92 drives the shutter 91 to open the inlet-outlet port 2x when the substrate W is carried into and carried out from the substrate cleaning device 1. Further, the shutter driver 92 drives the shutter 91 to close the inlet-outlet port 2x when the substrate W is cleaned in the substrate cleaning device 1.

The base device 30 is provided in the center portion of the bottom surface portion 2a. The base device 30 includes linear guides 31, a mobile base 32 and a base driver 33. The linear guides 31 include two rails and are provided to extend in the Y direction from positions in the vicinity of the sidewall portion 2b to positions in the vicinity of the sidewall portion 2c in plan view. The mobile base 32 is provided to be movable in the Y direction on the two rails of the linear guides 31. The base driver 33 includes a pulse motor, for example, and moves the mobile base 32 in the Y direction on the linear guides 31.

The lower holding device 20 and the lower-surface cleaning device 50 are provided on the mobile base 32 to be arranged in the Y direction. The lower holding device 20 includes a suction holder 21, a suction holding driver 221 and two back rinse nozzles 29. The suction holder 21 is a so-called spin chuck, has a circular suction surface that can hold a lower surface of the substrate W by suction and is configured to be rotatable about an axis extending in an up-and-down direction (the axis extending in the Z direction). In the following description, a region that is to be sucked by the suction surface of the suction holder 21 in the lower surface of the substrate W when the substrate W is held by suction by the suction holder 21 is referred to as a lower-surface center region. On the other hand, the region, surrounding the lower-surface center region, in the lower surface of the substrate W is referred to as a lower-surface outer region.

The suction holding driver 22 includes a motor. The motor of the suction holding driver 22 is provided on the mobile base 32 such that its rotation shaft projects upwardly. The suction holder 21 is provided at the upper end portion of the rotation shaft of the suction holding driver 22. Further, in the rotation shaft of the suction holding driver 22, a suction path for holding the substrate W by suction in the suction holder 21 is formed. The suction path is connected to a suction device (not shown). The suction holding driver 22 rotates the suction holder 21 about the above-mentioned rotation shaft.

As shown in FIG. 1, the two back rinse nozzles 29 are arranged in the vicinity of the suction holding driver 22 so as to interpose the suction holder 21 in the X direction in plan view. A back rinse liquid supplier 28 (FIG. 3) is connected to each back rinse nozzle 29. The back rinse liquid supplier 28 supplies a cleaning liquid to the back rinse nozzle 29. As described below, when the upper surface, the outer peripheral end and the lower-surface outer region of the substrate W are cleaned at the same time in the substrate cleaning device 1, the back rinse nozzles 29 discharge the cleaning liquid supplied from the back rinse liquid supplier 28 to the lower-surface outer region of the substrate W. In the present embodiment, pure water (DIW: De-Ionized Water) is used as the cleaning liquid supplied to the back rinse liquid supplier 28.

On the mobile base 32, the receiving-transferring device 40 is further provided in the vicinity of the lower holding device 20. The receiving-transferring device 40 includes a plurality (three in the present example) of support pins 41, a pin coupling member 42 and a pin lifting-lowering driver 43. The pin coupling member 42 is formed to surround the suction holder 21 in plan view and couples the plurality of support pins 41 to one another. The plurality of support pins 41 extend upwardly by a certain length from the pin coupling member 42 while being coupled to one another by the pin coupling member 42. The pin lifting-lowering driver 43 lifts and lowers the pin coupling member 42 on the mobile base 32. Thus, the plurality of support pins 41 are lifted and lowered relative to the suction holder 21.

The lower-surface cleaning device 50 includes a lower-surface brush 51, two liquid nozzles 52, a gas injector 53, a lifting-lowering supporter 54, a movement supporter 55, a lower-surface brush rotation driver 55a, a lower-surface brush lifting-lowering driver 55b and a lower-surface brush movement driver 55c. The movement supporter 55 is provided to be movable in the Y direction with respect to the lower holding device 20 in a certain region on the mobile base 32. As shown in FIG. 2, the lifting-lowering supporter 54 is provided on the movement supporter 55 to be liftable and lowerable. The lifting-lowering supporter 54 has an upper surface 54u that is inclined downwardly in a direction away from the suction holder 21 (rearwardly in the present example).

As shown in FIG. 1, the lower-surface brush 51 has a circular outer shape in plan view and is formed to be relatively large in the present embodiment. Specifically, the diameter of the lower-surface brush 51 is larger than the diameter of the suction surface of the suction holder 21 and is 1.3 times of the diameter of the suction surface of the suction holder 21, for example. Further, the diameter of the lower-surface brush 51 is larger than 1/3 of the diameter of the substrate W and smaller than 1/2 of the diameter of the substrate W. The diameter of the substrate W is 300 mm, for example.

The lower-surface brush 51 may be formed of a relatively soft resin material such as PVA (Polyvinyl alcohol) or PTFE (Polytetrafluoroethylene). The lower-surface brush 51 has a cleaning surface that can come into contact with the lower surface of the substrate W. Further, the lower-surface brush 51 is provided on the upper surface 54*u* of the lifting-lowering supporter 54 such that the cleaning surface is directed upwardly and rotatable about an axis extending in the up-and-down direction through the center of the cleaning surface.

Each of the two liquid nozzles 52 is attached to the upper surface 54*u* of the lifting-lowering supporter 54 to be located in the vicinity of the lower-surface brush 51. Further, each of the two liquid nozzles 52 is attached to the upper surface 54*u* such that a liquid discharge port is directed upwardly of the lower-surface brush 51. A lower-surface cleaning liquid supplier 56 (FIG. 3) is connected to the liquid nozzles 52. The lower-surface cleaning liquid supplier 56 supplies the cleaning liquid to the liquid nozzles 52. As described below, the liquid nozzles 52 discharge the cleaning liquid supplied from the lower-surface cleaning liquid supplier 56 to the lower-surface center region of the substrate W immediately before the lower-surface center region of the substrate W is cleaned in the substrate cleaning device. On the other hand, the liquid nozzles 52 do not discharge the cleaning liquid to the lower-surface center region of the substrate W during cleaning of the lower-surface center region of the substrate W in the substrate cleaning device 1. In the present embodiment, pure water (DIW) is used as the cleaning liquid to be supplied to the liquid nozzles 52.

The gas injector 53 is a slit-like gas injection nozzle having a gas injection port extending in one direction. The gas injector 53 is attached to the upper surface 54*u* of the lifting-lowering supporter 54 to be located between the lower-surface brush 51 and the suction holder 21 in plan view. Further, the gas injector 53 is attached to the upper surface 54*u* of the lifting-lowering supporter 54 such that a gas injection port is directed upwardly. An injection gas supplier 57 (FIG. 3) is connected to the gas injector 53. The injection gas supplier 57 supplies gas to the gas injector 53. In the present embodiment, an inert gas such as a nitrogen gas is used as the gas to be supplied to the gas injector 53. The gas injector 53 injects the gas supplied from the injection gas supplier 57 to the lower surface of the substrate W during cleaning of the substrate W by the lower-surface brush 51 and during drying of the lower surface of the substrate W, as described below. In this case, a strip-shaped gas curtain extending in the X direction is formed between the lower-surface brush 51 and the suction holder 21.

The lower-surface brush rotation driver 55*a* includes a motor, and rotates the lower-surface brush 51 during cleaning of the substrate W by the lower-surface brush 51. The lower-surface brush lifting-lowering driver 55*b* includes a stepping motor or an air cylinder, and lifts and lowers the lifting-lowering supporter 54 with respect to the movement supporter 55. The lower-surface brush movement driver 55*c* includes a motor, and moves the movement supporter 55 in the Y direction on the mobile base 32. Here, the position of the lower holding device 20 in the mobile base 32 is fixed. Therefore, when being moved by the lower-surface brush movement driver 55*c* in the Y direction, the movement supporter 55 is moved relative to the lower holding device 20. In the following description, the position of the lower-surface cleaning device 50 being located closest to the lower holding device 20 on the mobile base 32 is referred to as a proximal position, and the position of the lower-surface cleaning device 50 located farthest from the lower holding device 20 on the mobile base 32 is referred to as a distal position.

The cup device 60 is further provided in the center portion of the bottom surface portion 2*a*. The cup device 60 includes a cup 61 and a cup driver 62. The cup 61 is provided to surround the lower holding device 20 and the base device 30 in plan view, and be liftable and lowerable. In FIG. 2, the cup 61 is indicated by the dotted lines. The cup driver 62 moves the cup 61 between a lower cup position and an upper cup position in accordance with which portion of the lower surface of the substrate W is to be cleaned by the lower-surface brush 51. The lower cup position is a height position at which the upper end portion of the cup 61 is located farther downwardly than the substrate W held by suction by the suction holder 21. Further, the upper cup position is a height position at which the upper end portion of the cup 61 is located farther upwardly than the suction holder 21.

At height positions farther upward than the cup 61, the pair of upper holding devices 10A, 10B is provided to be opposite to each other with the base device 30 held therebetween in plan view. The upper holding device 10A includes a lower chuck 11A, an upper chuck 12A, a lower chuck driver 13A and an upper chuck driver 14A. The upper holding device 10B includes a lower chuck 11B, an upper chuck 12B, a lower chuck driver 13B and an upper chuck driver 14B.

The lower chucks 11A, 11B are arranged symmetrically with respect to a vertical plane extending in the Y direction (a forward-and-rearward direction) through the center of the suction holder 21 in plan view, and are provided to be movable in the X direction in a common horizontal plane. Each of the lower chucks 11A, 11B has two support pieces that can support the lower-surface peripheral portion of the substrate W from below the substrate W. The lower chuck drivers 13A, 13B move the lower chucks 11A, 11B such that the lower chucks 11A, 11B are closer to each other or are farther away from each other.

Similarly to the lower chucks 11A, 11B, the upper chucks 12A, 12B are arranged symmetrically with respect to the vertical plane extending in the Y direction (the forward-and-rearward direction) through the center of the suction holder 21 in plan view, and are provided to be movable in the X direction in a common horizontal plane. Each of the upper chucks 12A, 12B has two holding pieces that are configured to abut against two portions of the outer peripheral end of the substrate W and be capable of holding the outer peripheral end of the substrate W. The upper chuck drivers 14A, 14B move the upper chucks 12A, 12B such that the upper chucks 12A, 12B are closer to each other or farther away from each other.

As shown in FIG. 1, at a position near one side of the cup 61, the upper-surface cleaning device 70 is provided to be located in the vicinity of the upper holding device 10B in plan view. The upper-surface cleaning device 70 includes a rotation support shaft 71, an arm 72, a spray nozzle 73 and an upper-surface cleaning driver 74.

The rotation support shaft 71 is supported on the bottom surface portion 2*a* by the upper-surface cleaning driver 74 to extend in the up-and-down direction, and to be liftable, lowerable and rotatable. As shown in FIG. 2, at a position farther upward than the upper holding device 10B, the arm 72 is provided to extend in the horizontal direction from the upper end portion of the rotation support shaft 71. The spray nozzle 73 is attached to the tip portion of the arm 72.

An upper-surface cleaning fluid supplier 75 (FIG. 3) is connected to the spray nozzle 73. The upper-surface cleaning fluid supplier 75 supplies the cleaning liquid and gas to the spray nozzle 73. In the present embodiment, pure water (DIW) is used as the cleaning liquid to be supplied to the spray nozzle 73, and an inert gas such as a nitrogen gas is used as the gas to be supplied to the spray nozzle 73. When the upper surface of the substrate W is cleaned, the spray nozzle 73 mixes the cleaning liquid and gas supplied from the upper-surface cleaning fluid supplier 75 to produce a fluid mixture, and injects the produced fluid mixture downwardly.

The upper-surface cleaning driver 74 includes one or a plurality of pulse motors, an air cylinder and the like, lifts and lowers the rotation support shaft 71 and rotates the rotation support shaft 71. With the above-mentioned configuration, on the upper surface of the substrate W held by suction and rotated by the suction holder 21, the spray nozzle 73 is moved in a circular arc shape. Thus, the entire upper surface of the substrate W can be cleaned.

As shown in FIG. 1, at a position near the other side of the cup 61, the end-portion cleaning device 80 is provided to be located in the vicinity of the upper holding device 10A in plan view. The end-portion cleaning device 80 includes a rotation support shaft 81, an arm 82, a bevel brush 83 and a bevel brush driver 84.

The rotation support shaft 81 is supported on the bottom surface portion 2a by the bevel brush driver 84 to extend in the up-and-down direction and to be liftable, lowerable and rotatable. As shown in FIG. 2, at a position farther upward than the upper holding device 10A, the arm 82 is provided to extend in the horizontal direction from the upper end portion of the rotation support shaft 81. At the tip portion of the arm 82, the bevel brush 83 is provided to project downwardly and to be rotatable about an axis extending in the up-and-down direction.

In the bevel brush 83, its upper half portion has an inverse trapezoidal shape, and its lower half portion has a trapezoidal shape. With this bevel brush 83, the outer peripheral end of the substrate W can be cleaned by the center portion in the up-and-down direction of the outer peripheral surface.

The bevel brush driver 84 includes one or a plurality of pulse motors, an air cylinder and the like, lifts and lowers the rotation support shaft 81 and rotates the rotation support shaft 81. With the above-mentioned configuration, the center portion of the outer peripheral surface of the bevel brush 83 is brought into contact with the outer peripheral end of the substrate W held by suction and rotated by the suction holder 21. Thus, the entire outer peripheral end of the substrate W can be cleaned.

Here, the bevel brush driver 84 further includes a motor built in the arm 82. The motor rotates the bevel brush 83 provided at the tip portion of the arm 82 about the axis extending in the up-and-down direction. Therefore, when the outer peripheral end of the substrate W is cleaned, a cleaning force of the bevel brush 83 in the outer peripheral end of the substrate W is improved by rotation of the bevel brush 83.

FIG. 3 is a block diagram showing the configuration of a control system of the substrate cleaning device 1 of FIG. 1. A controller 9 of FIG. 3 includes a CPU (Central Processing Unit), a RAM (Random Access Memory), a ROM (Read Only Memory) and a storage device. The RAM is used as a work area for the CPU. The ROM stores a system program. The storage device stores a control program. The operation of each component in the substrate cleaning device 1 is controlled by execution of a substrate cleaning program stored in the storage device on the RAM by the CPU.

As shown in FIG. 3, the controller 9 controls the lower chuck drivers 13A, 13B and the upper chuck drivers 14A, 14B in order to mainly receive the substrate W that is carried into the substrate cleaning device 1 and hold the substrate W at a position above the suction holder 21. Further, the controller 9 mainly controls the suction holding driver 22 in order to hold the substrate W by suction using the suction holder 21 and rotate the substrate W held by suction. Further, mainly during cleaning of the upper surface of the substrate W, the controller 9 controls the back rinse liquid supplier 28 to prevent the cleaning liquid from flowing from the upper surface to the lower surface through the outer peripheral end of the substrate W and to clean the lower-surface outer region of the substrate W.

Further, the controller 9 mainly controls the base driver 33 in order to move the mobile base 32 with respect to the substrate W held by the upper holding devices 10A, 10B. Further, the controller 9 controls the pin lifting-lowering driver 43 in order to move the substrate W between a height position of the substrate W held by the upper holding devices 10A, 10B and a height position of the substrate W held by the suction holder 21.

Further, the controller 9 controls the lower-surface brush rotation driver 55a, the lower-surface brush lifting-lowering driver 55b, the lower-surface brush movement driver 55c, the lower-surface cleaning liquid supplier 56 and the injection gas supplier 57 in order to clean the lower surface of the substrate W. Further, the controller 9 controls the cup driver 62 in order to receive the cleaning liquid splashed from the substrate W using the cup 61 when the substrate W held by the suction by the suction holder 21 is cleaned.

Further, the controller 9 controls the upper-surface cleaning driver 74 and the upper-surface cleaning fluid supplier 75 in order to clean the upper surface of the substrate W held by suction by the suction holder 21. Further, the controller 9 controls the bevel brush driver 84 in order to clean the outer peripheral end of the substrate W held by suction by the suction holder 21. Further, the controller 9 controls the shutter driver 92 in order to open and close the inlet-outlet port 2x of the unit casing 2 when the substrate W is carried into and carried out from the substrate cleaning device 1.

2. Schematic Operation of Substrate Cleaning Device 1

FIGS. 4 to 16 are schematic diagrams for explaining the schematic operation of the substrate cleaning device 1 of FIG. 1. In each of FIGS. 4 to 16, the plan view of the substrate cleaning device 1 is shown in the upper field. Further, the side view of the lower holding device 20 and its peripheral portions as viewed in the Y direction is shown in the middle field, and the side view of the lower holding device 20 and its peripheral portions as viewed in the X direction is shown in the bottom field. The side view in the middle field corresponds to the side view of the substrate cleaning device 1 taken along the line A-A of FIG. 1, and the side view in the bottom field corresponds to the side view of the substrate cleaning device 1 taken along the line B-B of FIG. 1. The expansion and contraction rates of part of the constituent elements are different for the plan view in the upper field and the side views in the middle and bottom fields in order to facilitate understanding of the shape and operation state of each constituent element in the substrate cleaning device 1. Further, in each of FIGS. 14 to 16, the cup 61 is indicated by the two-dots and dash lines, and the outer shape of the substrate W is indicated by the thick one-dot and dash lines.

In the initial state before the substrate W is carried into the substrate cleaning device 1, the inlet-outlet port 2x is closed by the shutter 91 of the opening-closing device 90. Further, as shown in FIG. 1, the lower chucks 11A, 11B are maintained in a state in which the distance between the lower chucks 11A, 11B is sufficiently larger than the diameter of the substrate W. Further, the upper chucks 12A, 12B are also maintained in a state in which the distance between the upper chucks 12A, 12B is sufficiently larger than the diameter of the substrate W. Further, the mobile base 32 of the base device 30 is arranged such that the center of the suction holder 21 is located at the center of the cup 61 in plan view. The lower-surface cleaning device 50 is arranged in the proximal position on the mobile base 32. In the lifting-lowering supporter 54 of the lower-surface cleaning device 50, the cleaning surface (the upper end portion) of the lower-surface brush 51 is located farther downwardly than the suction holder 21.

Further, in the receiving-transferring device 40, the plurality of support pins 41 are located farther downwardly than the suction holder 21. Further, in the cup device 60, the cup 61 is in the lower cup position. In the following description, the center position of the cup 61 in plan view is referred to as a plane reference position rp. Further, the position of the mobile base 32 located on the bottom surface portion 2a when the center of the suction holder 21 is in the plane reference position rp in plan view is referred to as a first horizontal position.

The substrate W is carried into the unit casing 2 of the substrate cleaning device 1. Specifically, the shutter 91 opens the inlet-outlet port 2x immediately before the substrate W is carried in. Thereafter, as indicated by the thick solid arrow a1 in FIG. 4, a hand (substrate holder) RH of a substrate transporting robot (not shown) carries the substrate W to the substantially center position in the unit casing 2 through the inlet-outlet port 2x. At this time, the substrate W held by the hand RH is located between the lower chuck 11A and the upper chuck 12A, and the lower chuck 11B and the upper chuck 12B as shown in FIG. 4.

Next, as indicated by the thick solid arrows a2 in FIG. 5, the lower chucks 11A, 11B move closer to each other such that a plurality of support pieces of the lower chucks 11A, 11B are located below the lower-surface peripheral portion of the substrate W. In this state, the hand RH is lowered and exits from the inlet-outlet port 2x. Thus, a plurality of portions of the lower-surface peripheral portion of the substrate W held by the hand RH are supported by the plurality of support pieces of the lower chucks 11A, 11B. After the hand RH exits, the shutter 91 closes the inlet-outlet port 2x.

Next, as indicated by the thick solid arrows a3 in FIG. 6, the upper chucks 12A, 12B move closer to each other such that a plurality of holding pieces of the upper chucks 12A, 12B abut against the outer peripheral end of the substrate W. The plurality of holding pieces of the upper chucks 12A, 12B abut against a plurality of portions of the outer peripheral end of the substrate W, whereby the substrate W supported by the lower chucks 11A, 11B is further held by the upper chucks 12A, 12B. Further, as indicated by the thick solid arrow a4 in FIG. 6, the mobile base 32 is moved forwardly from the first horizontal position such that suction holder 21 deviates from the plane reference position rp by a predetermined distance and the center of the lower-surface brush 51 is located at the plane reference position rp. Thus, the cleaning surface of the lower-surface brush 51 faces the lower-surface center region of the substrate W at a position below the substrate W held by the upper chucks 12A, 12B.

At this time, the position of the mobile base 32 located on the bottom surface portion 2a is referred to as a second horizontal position.

Next, as indicated by the outlined arrow AA in the lower field of FIG. 7, the liquid nozzle 52 discharges the cleaning liquid upwardly of the lower-surface brush 51. The cleaning liquid discharged from the liquid nozzle 52 collides with the lower-surface center region of the substrate W. Thus, the lower-surface center region of the substrate W is wetted with the cleaning liquid. The flow rate of the cleaning liquid discharged from the liquid nozzle 52 (the flow rate of the cleaning liquid discharged per unit time) is set to such an extent that the cleaning liquid supplied to the lower-surface center region of the substrate W does not reach the outer peripheral end of the substrate W.

A large portion of the cleaning liquid that has collided with the lower-surface center region of the substrate W falls to a position below the substrate W. The cleaning liquid falling from the lower-surface center region of the substrate W is received by the cleaning surface of the lower-surface brush 51. Thus, the cleaning surface of the lower-surface brush 51 is wetted. When the cleaning liquid is discharged from the liquid nozzle 52 to such an extent that the cleaning surface of the lower-surface brush 51 is sufficiently wetted, an operation of discharging the cleaning liquid by the liquid nozzle 52 is stopped.

Next, as indicated by the thick solid arrow a5 in FIG. 8, the lifting-lowering supporter 54 is lifted such that the cleaning surface of the lower-surface brush 51 comes into contact with the lower-surface center region of the substrate W. Further, as indicated by the thick solid arrow a6 in FIG. 8, the lower-surface brush 51 wetted with the cleaning liquid is rotated (spins) about the axis extending in the up-and-down direction. Thus, contaminants adhering to the lower-surface center region of the substrate W are physically stripped by the lower-surface brush 51. At this time, the rotation speed of the lower-surface brush 51 is set in a range of not less than 100 rpm and not more than 250 rpm, for example. By setting the rotation speed of the lower-surface brush 51 to a value equal to or higher than 100 rpm, it is possible to ensure contamination removal capability required for cleaning the lower-surface center region of the substrate W. Further, by setting the rotation speed of the lower-surface brush 51 to a value equal to or lower than 250 rpm, the cleaning liquid being splashed from the lower-surface brush 51 falls in the range of the outer edge of the substrate W in plan view during cleaning of the lower-surface center region of the substrate W.

In the bottom field in FIG. 8, an enlarged side view of a portion in which the lower-surface brush 51 come into contact with the lower surface of the substrate W is shown in a balloon. As shown in the balloon, with the lower-surface brush 51 in contact with the substrate W, the liquid nozzle 52 and the gas injector 53 are held at positions close to the lower surface of the substrate W. At this time, the cleaning liquid is not discharged from the liquid nozzle 52 to the substrate W.

However, immediately before the lower-surface brush 51 comes into contact with the substrate W, the lower-surface center region of the substrate W and the cleaning surface of the lower-surface brush 51 are wetted. Thus, part of the cleaning liquid present between the lower-surface center region of the substrate W and the lower-surface brush 51 flows downwardly of the lower-surface brush 51 or being splashed downwardly of the lower-surface brush 51 together with contaminants removed from the lower surface of the substrate W.

Here, the upper surface 54*u* of the lifting-lowering supporter 54 is inclined downwardly in a direction away from the suction holder 21. In this case, in a case in which the cleaning liquid including contaminants falls on the lifting-lowering supporter 54 from the lower surface of the substrate W, the cleaning liquid received by the upper surface 54*u* is guided in a direction away from the suction holder 21.

When the lower-surface center region of the substrate W is cleaned by the lower-surface brush 51, the gas injector 53 injects gas toward the lower surface of the substrate W while being located between the lower-surface brush 51 and suction holder 21, as indicated by the outlined arrow a52 in the balloon of FIG. 8. In the present embodiment, the gas injector 53 is attached onto the lifting-lowering supporter 54 such that the gas injection port extends in the X direction. In this case, when gas is injected to the lower surface of the substrate W from the gas injector 53, a strip-shaped gas curtain extending in the X direction is formed between the lower-surface brush 51 and the suction holder 21. Thus, when the lower-surface center region of the substrate W is cleaned by the lower-surface brush 51, the cleaning liquid including contaminants is prevented from being splashed toward the suction holder 21. Thus, when the lower-surface center region of the substrate W is cleaned by the lower-surface brush 51, the cleaning liquid including contaminants is prevented from adhering to the suction holder 21, and the suction surface of the suction holder 21 is kept clean.

While the gas injector 53 injects gas obliquely upwardly toward the lower-surface brush 51 from the gas injector 53 as indicated by the outlined arrow a52 in the example of FIG. 8, the present invention is not limited to this. The gas injector 53 may inject gas in the Z direction toward the lower surface of the substrate W from the gas injector 53.

Next, in the state shown in FIG. 8, when the cleaning of the lower-surface center region of the substrate W is completed, the rotation of the lower-surface brush 51 is stopped, and the lifting-lowering supporter 54 is lowered such that the cleaning surface of the lower-surface brush 51 is spaced apart from the substrate W by a predetermined distance. At this time, the injection of gas from the gas injector 53 to the substrate W continues.

Thereafter, as indicated by the thick solid arrow a7 in FIG. 9, the mobile base 32 is moved rearwardly such that the suction holder 21 is located at the plane reference position rp. That is, the mobile base 32 is moved from the second horizontal position to the first horizontal position. At this time, injection of gas from the gas injector 53 to the substrate W continues, so that the lower-surface center region of the substrate W is sequentially dried by a gas curtain.

Next, as indicated by the thick solid arrow a8 in FIG. 10, the lifting-lowering supporter 54 is lowered such that the cleaning surface of the lower-surface brush 51 is located farther downwardly than the suction surface (upper end portion) of the suction holder 21. Further, as indicated by the thick solid arrows a9 in FIG. 10, the upper chucks 12A, 12B move away from each other such that the plurality of holding pieces of the upper chucks 12A, 12B are spaced apart from the outer peripheral end of the substrate W. At this time, the substrate W is being supported by the lower chucks 11A, 11B.

Thereafter, as indicated by the thick solid arrow a10 in FIG. 10, the pin coupling member 42 is lifted such that the upper end portions of the plurality of support pins 41 are located slightly farther upwardly than the lower chucks 11A, 11B. Thus, the substrate W supported by the lower chucks 11A, 11B is received by the plurality of support pins 41.

Next, as indicated by the thick solid arrows a11 in FIG. 11, the lower chucks 11A, 11B move away from each other. At this time, the lower chucks 11A, 11B move to positions at which the lower chucks 11A, 11B do not overlap with the substrate W supported by the plurality of support pins 41 in plan view. Thus, both of the upper holding devices 10A, 10B return to the initial state.

Next, as indicated by the thick solid arrow a12 in FIG. 12, the pin coupling member 42 is lowered such that the upper end portions of the plurality of support pins 41 are located farther downwardly than the suction holder 21. Thus, the substrate W supported on the plurality of support pins 41 is received by the suction holder 21. In this state, the suction holder 21 holds the lower-surface center region of the substrate W by suction. At the same time as the pin coupling member 42 is lowered or after the pin coupling member 42 is lowered, the cup 61 is lifted from the lower cup position to the upper cup position as indicated by the thick solid arrow a13 in FIG. 12.

Next, as indicated by the thick solid arrow a14 in FIG. 13, the suction holder 21 rotates about the axis extending in the up-and-down direction (an axial center of the rotation shaft of the suction holding driver 22). Thus, the substrate W held by suction by the suction holder 21 is rotated in a horizontal attitude. Further, as indicated by the outlined arrows AB in the middle field of FIG. 13, the back rinse nozzles 29 discharge the cleaning liquid toward the lower-surface outer region of the substrate W. At this time, because the substrate W is rotating, the cleaning liquid discharged from the back rinse nozzles 29 spreads over the entire lower-surface outer region of the substrate W and is splashed outwardly of the substrate W.

Next, the rotation support shaft 71 of the upper-surface cleaning device 70 is rotated and lowered. Thus, as indicated by the thick solid arrow a15 in FIG. 13, the spray nozzle 73 is moved to a position above the center of the substrate W, and the spray nozzle 73 is lowered such that the distance between the spray nozzle 73 and the substrate W is a predetermined distance. In this state, the spray nozzle 73 injects the fluid mixture of the cleaning liquid and gas to the upper surface of the substrate W. Further, the rotation support shaft 71 is rotated. Further, as indicated by the thick solid arrow a16 in FIG. 13, the spray nozzle 73 moves outwardly from the center of the rotating substrate W. The fluid mixture is injected to the entire upper surface of the substrate W, so that the entire upper surface of the substrate W is cleaned. When the upper surface of the substrate W is cleaned, the cleaning liquid supplied from the back rinse nozzle 29 to the lower-surface outer region of the substrate W prevents the cleaning liquid from flowing from the upper surface of the substrate W to the lower surface of the substrate W.

Further, when the upper surface of the substrate W is cleaned by the spray nozzle 73, the rotation support shaft 81 of the end-portion cleaning device 80 is rotated and lowered. Thus, as indicated by the thick solid arrow a17 in FIG. 13, the bevel brush 83 is moved to a position above the outer peripheral end of the substrate W. Further, the bevel brush 83 is lowered such that the center portion of the outer peripheral surface of the bevel brush 83 comes into contact with the outer peripheral end of the substrate W. In this state, the bevel brush 83 is rotated (spins) about the axis extending in the up-and-down direction. Thus, contaminants adhering to the outer peripheral end of the substrate W are physically stripped by the bevel brush 83. Contaminants that have been stripped from the outer peripheral end of the substrate W are washed away by the cleaning liquid discharged from the back rinse nozzles 29 to the substrate W and the cleaning liquid of the mixed fluid injected from the spray nozzle 73 to the substrate W.

Further, when the upper surface of the substrate W is cleaned by the spray nozzle 73, the lifting-lowering supporter 54 is lifted such that the cleaning surface of the lower-surface brush 51 comes into contact with the lower-surface outer region of the substrate W. Further, as indicated by the thick solid arrow a18 in FIG. 13, the lower-surface brush 51 is rotated (spins) about the axis extending in the up-and-down direction. At this time, the gas injector 53 injects gas toward the lower surface of the substrate W. Thus, it is possible to clean the entire lower-surface outer region of the substrate W held by suction and rotated by the suction holder 21 using the lower-surface brush 51. The rotation speed of the lower-surface brush 51 during cleaning of the lower-surface outer region of the substrate W is set in a range of not less than 5 rpm and not more than 60 rpm, for example.

The rotation direction of the lower-surface brush 51 may be opposite to the rotation direction of the suction holder 21. In this case, the entire lower-surface outer region of the substrate W can be cleaned efficiently. In the present embodiment, in plan view, the rotation direction of the suction holder 21 is clockwise, and the rotation direction of the lower-surface brush 51 is counterclockwise. In a case in which the lower-surface brush 51 is not relatively large, the movement supporter 55 may advance and retreat between the proximal position and the distal position on the mobile base 32 as indicated by the thick solid arrow a19 in FIG. 13. Even in this case, it is possible to clean the entire lower-surface outer region of the substrate W held by suction and rotated by the suction holder 21 using the lower-surface brush 51.

Next, when cleaning of the upper surface, the outer peripheral end and the lower-surface outer region of the substrate W is completed, injection of a fluid mixture from the spray nozzle 73 to the substrate W is stopped. Further, as indicated by the thick solid arrow a20 in FIG. 14, the spray nozzle 73 is moved to a position near one side of the cup 61 (the position in the initial state). Further, as indicated by the thick solid arrow a21 in FIG. 14, the bevel brush 83 is moved to a position near the other side of the cup 61 (the position in the initial state). Further, the rotation of the lower-surface brush 51 is stopped, and the lifting-lowering supporter 54 is lowered such that the cleaning surface of the lower-surface brush 51 is spaced apart from the substrate W by a predetermined distance. Further, the discharging of the cleaning liquid from the back rinse nozzles 29 to the substrate W and the injection of gas from the gas injector 53 to the substrate W are stopped. In this state, the suction holder 21 is rotated at a high speed, so that the cleaning liquid adhering to the substrate W is shaken off, and the entire substrate W is dried.

Next, as indicated by the thick solid arrow a22 in FIG. 15, the cup 61 is lowered from the upper cup position to the lower cup position. Further, as indicated by the thick solid arrows a23 in FIG. 15, the lower chucks 11A, 11B move close to each other to a position at which the lower chucks 11A, 11B can support a new substrate W in preparation for the new substrate W being carried into the unit casing 2.

Finally, the substrate W is carried out from the unit casing 2 of the substrate cleaning device 1. Specifically, the shutter 91 opens the inlet-outlet port 2*x* immediately before the substrate W is carried out. Thereafter, as indicated by the thick solid arrow a24 in FIG. 16, the hand (substrate holder) RH of the substrate transferring robot (not shown) enters the unit casing 2 through the inlet-outlet port 2*x*. Subsequently, the hand RH receives the substrate W on the suction holder 21 and exits from the inlet-outlet port 2*x*. After the hand RH exits, the shutter 91 closes the inlet-outlet port 2*x*.

3. Effects

FIG. 17 is a diagram for explaining the main effects of the present invention obtained by a series of operations of the substrate cleaning device 1 shown in FIGS. 4 to 16. In the substrate cleaning device 1, at first, the substrate W is held by the upper holding devices 10A, 10B while being not rotatable. Further, the lower-surface center region of the substrate W held by the upper holding devices 10A, 10B is cleaned. During cleaning, as shown in the upper field of FIG. 17, before the cleaning surface of the lower-surface brush 51 is pressed against the lower-surface center region of the substrate W, a predetermined amount of the cleaning liquid is supplied from the liquid nozzle 52 to the lower-surface center region of the substrate W. At this time, the lower-surface brush 51 is located directly below the lower-surface center region of the substrate W. Therefore, the cleaning liquid supplied to the lower-surface center region of the substrate W falls from the lower surface of the substrate W onto the lower-surface brush 51. Thus, the lower-surface brush 51 and the lower-surface center region of the substrate W are wetted.

Thereafter, as shown in the middle field of FIG. 17, the lower-surface brush 51 wetted with the cleaning liquid is pressed against the lower-surface center region of the substrate W. Further, the lower-surface brush 51 rotates about an axis extending in the up-and-down direction. Thus, the lower-surface center region of the substrate W is smoothly cleaned by the lower-surface brush 51.

When the lower-surface center region of the substrate W is cleaned, the substrate W is not rotated. Therefore, when the lower-surface center region of the substrate W is cleaned, the cleaning liquid hardly reaches the outer peripheral end of the substrate W. That is, the cleaning liquid does not flow from the lower surface of the substrate W to the upper surface of the substrate W. Thus, it is not necessary to supply the cleaning liquid to the upper surface of the substrate W in order to protect the upper-surface peripheral portion of the substrate W. Therefore, it is possible to reduce an amount of the cleaning liquid required for cleaning the lower surface of the substrate W.

When cleaning of the lower-surface center region of the substrate W ends, the substrate W held by the upper holding devices 10A, 10B is transferred to the lower holding device 20. The lower holding device 20 holds and rotates the transferred substrate W. In this state, regions of the surface of the substrate W excluding the lower-surface center region, that is, the upper surface, the outer peripheral end and the lower-surface outer region of the substrate W are cleaned. During the cleaning, as shown in the lower field of FIG. 17, a fluid mixture of the cleaning liquid and gas is supplied from the spray nozzle 73 to the upper surface of the substrate W, and the spray nozzle 73 scans on the upper surface of the substrate W. Further, the cleaning liquid is supplied from the two back rinse nozzles 29 to the lower-surface outer region of the substrate W. Further, the bevel brush 83 is pressed against the outer peripheral end of the substrate W, and the lower-surface brush 51 is pressed against the lower-surface outer region of the substrate W.

Here, the cleaning liquid supplied from the back rinse nozzles 29 to the lower-surface outer region of the substrate W prevents the cleaning liquid supplied to the upper surface of the substrate W from flowing to the lower surface of the substrate W. Thus, it is not necessary to separately perform the supply of the cleaning liquid for cleaning the lower-surface outer region of the substrate W and the back rinse for preventing the cleaning liquid supplied to the upper surface of the substrate W from flowing to the lower surface of the substrate W. As a result, an amount of the cleaning liquid required to clean the upper surface and the back surface of the substrate W can be reduced.

4. Example of Preferred Configuration of Lower-Surface Brush 51

The lower-surface brush 51 is attached a brush base, and then attached to the rotation shaft of a motor included in the lower-surface brush rotation driver 55a of FIG. 1 via the brush base. In the following description, a joined body of the lower-surface brush 51 and the brush base is referred to as a brush unit.

FIG. 18 is an external perspective view showing the example of the preferred configuration of the brush unit. As shown in FIG. 18, the brush unit 300 is constituted by the lower-surface brush 51 being attached onto the brush base 200. As described above, the lower-surface brush 51 may be formed of a relatively soft resin material such as PVA or PTFE. The brush base 200 may be formed of a relatively hard resin material such as PVC (polyvinyl chloride) or PP (polypropylene).

Figure 19:
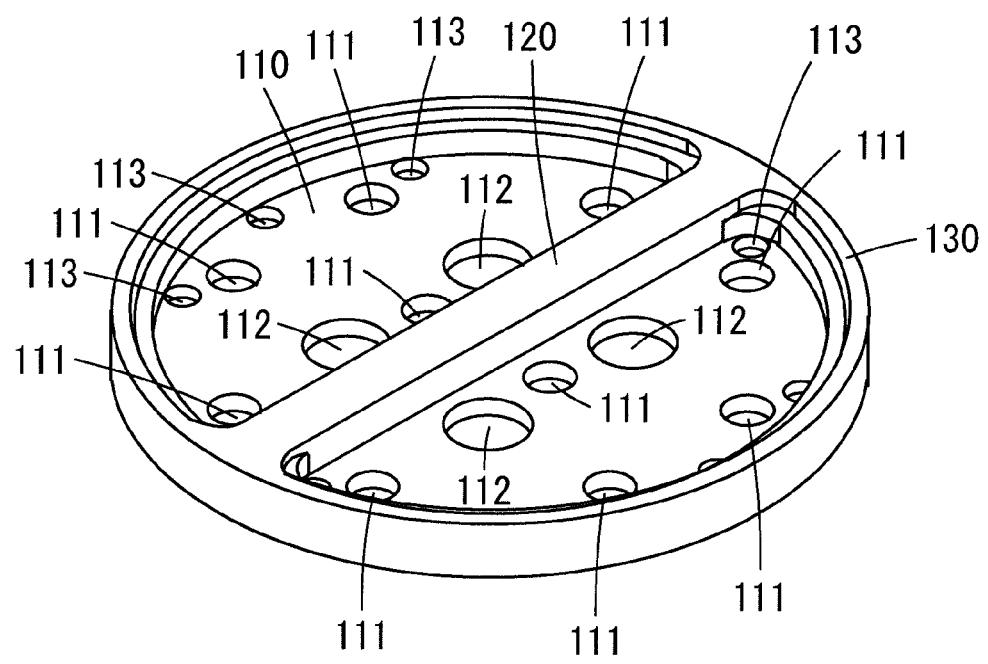
FIG. 19 is an external perspective view of a lower-surface brush of FIG. 18.

FIG. 19 is an external perspective view of the lower-surface brush 51 of FIG. 18. FIG. 20 is a plan view of the lower-surface brush 51 of FIG. 18. As shown in FIGS. 19 and 20, the lower-surface brush 51 includes a base portion 110 and cleaning portions 120, 130. The base portion 110 has a disc shape. In plan view, a geometric center 101 (FIG. 20) of the base portion 110 is defined.

The cleaning portions 120, 130 are formed on the upper surface of the base portion 110 so as to project upwardly from the upper surface of the base portion 110. The cleaning portion 120 is arranged so as to extend in a radial direction of the base portion 110 through the geometric center 101 of the base portion 110. The cleaning portion 130 is arranged to extend along the outer edge of the base portion 110. The cleaning portion 130 may come into contact with both ends of the cleaning portion 120. A projection amount of the cleaning portions 120, 130 with respect to the upper surface of the base portion 110 is 5 mm to 6 mm, for example. The width of the cleaning portion 120 and the width of the cleaning portion 130 may be equal to each other or different from each other.

A plurality of through holes 111, a plurality of through holes 112 and a plurality of through holes 113 are formed in the base portion 110. Each through hole 111 to 113 extends in the up-and-down direction. The through holes 111 are used to connect the base portion 110 to the brush base 200 of FIG. 18. 10 through holes 11 are provided in the present example. Specifically, 8 through holes 111 are arranged in the peripheral region of the base portion 110 at substantially equal angular intervals. 2 through holes 111 are arranged in the center region of the base portion 110 so as to be opposite to each other with the cleaning portion 120 interposed therebetween.

The through holes 112 are used to connect the brush base 200 to the motor for rotating the brush unit 330, or the like. 4 through holes 112 are provided in the present example. The four through holes 112 are arranged in the center region of the base portion 110 at substantially equal angular intervals to surround the geometric center 101 of the base portion 110. The through holes 113 are used to discharge the cleaning liquid for cleaning of a substrate. 10 through holes 113 are provided in the present example. The 10 through holes 113 are arranged systematically in the peripheral region of the base portion 110 so as to extend along the cleaning portion 130.

The brush base 200 is a plate-shape member having the outer shape similar to that of the base portion 110 of the lower-surface brush 100. FIG. 21 is a longitudinal cross sectional view of the brush unit 300 of FIG. 18. As shown in FIG. 21, a concave portion 210 is formed in the center region of the lower surface of the brush base 200. Further, an inclined portion 220 inclined outwardly and downwardly is formed in the peripheral region of the lower surface of the brush base 200. Further, a plurality of screw holes 201, a plurality of through holes 202 and a plurality of through holes 203 are formed in the brush base 200.

The plurality of screw holes 201 are provided in the upper surface of the brush base 200 to respectively correspond to the plurality of through holes 111 of the lower-surface brush 100. The plurality of through holes 202 are arranged to extend in the up-and-down direction and respectively correspond to the plurality of through holes 112 of the lower-surface brush 100. The plurality of through holes 203 are arranged to extend in the up-and-down direction and respectively correspond to the plurality of through holes 113 of the lower-surface brush 100.

A plurality of screw members 310 (FIG. 18) are respectively inserted into the plurality of through holes 111 of the lower-surface brush 100 from above. The lower end portion of each screw member 310 is attached to a corresponding screw hole 201 of the brush base 200. Thus, the lower-surface brush 100 and the brush base 200 are connected to each other, so that the brush unit 300 is completed. In the brush unit 300, the plurality of through holes 113 of the lower-surface brush 100 respectively communicates with the plurality of through holes 203 of the brush base 200.

As described above, the brush unit 300 is attached to the rotation shaft 400 of the motor of the lower-surface brush rotation driver 55a. Specifically, the upper end portion of the rotation shaft 400 is fitted to the concave portion 210 of the brush base 200 from below. A plurality of screw holes 401 respectively corresponding to the through holes 202 of the brush base 200 are formed in the rotation shaft 400. A plurality of screw members 320 (FIG. 18) are respectively inserted into the plurality of through holes 112 of the lower-surface brush 100 from above. The lower end portion of each screw member 320 is attached to a corresponding screw hole 401 of the rotation shaft 400 through a corresponding through hole 202 of the brush base 200.

In the brush unit 300 of FIG. 18, when the cleaning liquid is supplied onto the lower-surface brush 51, for example, part of the cleaning liquid is temporarily stored in the region inside of the cleaning portion 130. The stored cleaning liquid is gently discharged downwardly through the plurality of through holes. Therefore, with the above-mentioned brush unit 300, a predetermined amount of the cleaning liquid can be stored in the region inside of the cleaning portion 130 of the lower-surface brush 51 immediately before cleaning of the lower-surface center region of the substrate W is started. Thus, even during cleaning of the lower-surface center region of the substrate W the lower surface of which is not supplied with the cleaning liquid, contaminants adhering to the lower-surface center region of the substrate W are smoothly removed by the cleaning liquid stored in the cleaning portion 130 of the lower-surface brush 51.

Further, in the brush unit 300 of FIG. 18, the cleaning portion 120 is arranged so as to extend in the radial direction of the base portion 110 through the geometric center 101 of the base portion 110. Thus, the contact area of the lower-surface brush 51 with respect to the substrate W is increased as compared with the configuration in which only the cleaning portion 130 is formed on the base portion 110. Thus, it is possible to obtain a higher cleaning power for the lower surface of the substrate W.

The lower-surface brush 51 may have the configuration in which the cleaning portion 120 out of the cleaning portions 120, 130 of FIG. 19 is not included. Also in this case, during cleaning of the lower-surface center region of the substrate W, even with the cleaning liquid not supplied, the lower-surface center region of the substrate W is smoothly cleaned by the cleaning liquid stored in the cleaning portion 130 of the lower-surface brush 51.

5. Other Embodiments (1) While the lower-surface brush 51 pressed against the lower surface of the substrate W rotates about the axis extending in the up-and-down direction during cleaning of the lower-surface center region and the lower-surface outer region of the substrate W in the substrate cleaning device 1 according to the above-mentioned embodiment, the present invention is not limited to this. The lower-surface brush 51 may clean the lower-surface center region and the lower-surface outer region of the substrate W by moving or reciprocating linearly or in an arc shape on the lower surface of the substrate W instead of rotating about the axis extending in the up-and-down direction.

(2) While the two liquid nozzles 52 of the lower-surface cleaning device 50 discharge the cleaning liquid upwardly of the lower-surface brush 51 in the substrate cleaning device 1 according to the above-mentioned embodiment, the present invention is not limited to this. The liquid nozzles 52 may be configured to be capable of directly discharging the cleaning liquid toward the cleaning surface of the lower-surface brush 51. In this case, during cleaning of the lower-surface center region of the substrate W, the cleaning liquid is supplied from the liquid nozzles 52 to the lower-surface brush 51 in advance before the lower-surface brush 51 moves to a position below the substrate W. Thus, the lower-surface center region of the substrate W is cleaned by the wet lower-surface brush 51.

With the above-mentioned configuration, it is possible to clean the lower-surface brush 51 by discharging the cleaning liquid to the lower-surface brush 51 with the lower surface of the substrate W not cleaned. Further, it is possible to prevent the lower-surface brush 51 from being dried by discharging the cleaning liquid to the lower-surface brush 51 with the lower surface of the substrate W not cleaned.

(3) While pure water is used as the cleaning liquid for cleaning the substrate W in the substrate cleaning device 1 according to the above-mentioned embodiment, the present invention is not limited to this. As the cleaning liquid used for cleaning the substrate W, in addition to a rinse liquid such as pure water (DIW), a chemical liquid such as ammonia-hydrogen peroxide (SC1), hydrochloric acid-hydrogen peroxide (SC2), sulfuric acid-hydrogen peroxide (SPM), sulfuric acid-added water or hydrofluoric acid may be used.

Further, the cleaning liquid discharged from the back rinse nozzles 29, the cleaning liquid discharged from the liquid nozzles 52 and the cleaning liquid included in the fluid mixture discharged from the spray nozzle 73 may be the same or different types of cleaning liquids. In a case in which a plurality of types of cleaning liquids are used in the substrate cleaning device 1, the cleaning liquids may include a rinse liquid or a chemical liquid, or may include a rinse liquid and a chemical liquid.

(4) While the lower-surface outer region of the substrate W is cleaned in the lower holding device 20 after the lower-surface center region of the substrate W is cleaned in the upper holding devices 10A, 10B in the above-mentioned embodiment, the embodiment is not limited to this. The lower-surface center region of the substrate W may be cleaned in the upper holding devices 10A, 10B after the lower-surface outer region of the substrate W is cleaned in the lower holding device 20.

(5) While the upper surface of the substrate W is cleaned by scanning of the spray nozzle 73 from the center to the outer peripheral end of the substrate W in plan view in the above-mentioned embodiment, the embodiment is not limited to this. The spray nozzle 73 may clean the upper surface of the substrate W by scanning from the outer peripheral end to the center of the substrate W in a plan view. While the upper surface of the substrate W is cleaned with use of the spray nozzle 73 that injects a fluid mixture, the embodiment is not limited to this. The upper surface of the substrate W may be cleaned with use of a brush or may be cleaned with use of a cleaning liquid nozzle that discharges a cleaning liquid.

(6) While the substrate cleaning device 1 includes the controller 9 in the above-mentioned embodiment, the embodiment is not limited to this. In a case in which the substrate cleaning device 1 is configured to be controllable by an external information processing apparatus, the substrate cleaning device 1 does not have to include the controller 9.

6. Correspondences Between Constituent Elements in Claims and Parts in Preferred Embodiments In the following paragraphs, non-limiting examples of correspondences between various elements recited in the claims below and those described above with respect to various preferred embodiments of the present disclosure are explained. As each of various elements recited in the claims, various other elements having configurations or functions described in the claims can be also used.

In the above-mentioned embodiment, the substrate W is an example of a substrate, the substrate cleaning device 1 is an example of a substrate cleaning device, the upper holding devices 10A, 10B are examples of a first substrate holder, the lower-surface brush 51 is an example of a cleaning brush and a lower-surface brush, the lower-surface brush rotation driver 55a, the lower-surface brush lifting-lowering driver 55b and the lower-surface brush movement driver 55c are examples of a brush driver, and the controller 9 is an example of a controller.

Further, the liquid nozzle 52 and the lower-surface cleaning liquid supplier 56 are examples of a first lower-surface liquid supplier, the suction holder 21 of the lower holding device 20 is an example of a second substrate holder, the spray nozzle 73 and the upper-surface cleaning fluid supplier 75 are examples of an upper-surface liquid supplier, and the back rinse liquid supplier 28 and the back rinse nozzle 29 are examples of a second lower surface liquid supplier.

Further, the upper surface of the brush base 200 is an example of a flat surface, the brush base 200 is an example of a base portion, the cleaning portion 130 is an example of a first cleaning portion, the geometric center 101 is an example of a geometric center, and the cleaning portion 120 is an example of a second cleaning portion.

The invention claimed is:

1. A substrate cleaning device that cleans an upper surface and a lower surface of a substrate with use of a cleaning liquid, comprising:

a first substrate holder that holds the substrate in a horizontal attitude while not rotating the substrate by abutting against a plurality of portions of an outer peripheral end of the substrate;

a second substrate holder configured to contact a lower-surface center region of the substrate while holding and rotating the substrate;

a first lower-surface liquid supplier configured to eject the cleaning liquid towards a bottom surface of the substrate when the substrate is held by said first substrate holder;

a cleaning brush configured to come into contact with the lower surface of the substrate;

a brush driver configured to press the cleaning brush against the lower surface of the substrate held by the first substrate holder and move the cleaning brush relative to the substrate held by the first substrate holder; and a controller, wherein the controller controls the first lower-surface liquid supplier to have the first lower-surface liquid supplier eject the cleaning liquid onto the bottom surface of the substrate such that some of the ejected cleaning liquid falls from the bottom surface onto the cleaning brush in order to wet the cleaning brush, wherein the controller controls the brush driver such that the wetted cleaning brush is moved into contact with the lower-surface center region of the substrate, and wherein, after the cleaning brush is used to clean the lower-surface center region of the substrate, the controller controls the second substrate holder to come into contact with lower-surface center region of the substrate such that the substrate can be rotated by the second substrate holder.

2. The substrate cleaning device according to claim 1, wherein the second substrate holder rotates the substrate about an axis extending in an up-and-down direction while holding the substrate in a horizontal attitude by sucking the lower-surface center region of the substrate; and the apparatus further comprises:

an upper-surface liquid supplier that supplies the cleaning liquid to the upper surface of the substrate held by the second substrate holder; and a second lower-surface liquid supplier that supplies the cleaning liquid to a lower-surface outer region surrounding the lower-surface center region of the substrate held by the second substrate holder, wherein the brush driver is configured to further press the cleaning brush against the lower-surface outer region of the substrate held by the second substrate holder, and the controller controls the second substrate holder, the upper-surface liquid supplier, the second lower-surface liquid supplier and the brush driver such that the cleaning brush is pressed against the lower-surface outer region of the substrate while the cleaning liquid is supplied to the upper surface of the substrate rotated by the second substrate holder and the cleaning liquid is supplied to the lower-surface outer region of the substrate.

3. The substrate cleaning device according to claim 1, wherein the cleaning brush is a lower-surface brush used to clean the lower surface of the substrate, and the lower-surface brush includes a base portion having a flat surface directed upwardly, and a first cleaning portion provided at the flat surface of the base portion so as to project upwardly from the flat surface of the base portion and extend along an outer edge of the base portion.

4. The substrate cleaning device according to claim 3, wherein the lower-surface brush further includes a second cleaning portion provided at the flat surface of the base portion so as to project upwardly from the flat surface of the base portion and extend in one direction through a geometric center of the base portion in plan view.

5. A substrate cleaning method of cleaning an upper surface and a lower surface of a substrate with use of a cleaning liquid, including the steps of:

holding the substrate in a horizontal attitude while not rotating the substrate by using a first substrate holder that abuts against a plurality of portions of an outer peripheral end of the substrate;

ejecting the cleaning liquid towards the lower surface of the substrate while the substrate is held by the first substrate holder, wherein some of the ejected cleaning liquid falls from the lower surface of the substate onto the cleaning brush in order to wet the cleaning brush;

pressing the wetted cleaning brush against the lower surface of the substrate so that the wetted cleaning brush comes into contact with the lower surface of the substrate held by the first substrate holder; and moving the wetted cleaning brush relative to the substrate held by the first substrate holder; and after the moving of the wetted cleaning brush relative to the substrate held by the first substrate holder, bringing a second substrate holder into contact with the lower surface of the substrate, wherein the second substrate holder is configured to hold and rotate the substrate.

6. The substrate cleaning method according to claim 5, further including the steps of:

rotating the substrate about an axis extending in an up-and-down direction while holding the substrate in a horizonal attitude by using the second substrate holder, wherein the second substrate holder sucks a lower-surface center region of the substrate;

supplying the cleaning liquid to the upper surface of the substrate held and rotated by the second substrate holder; and supplying the cleaning liquid to a lower-surface outer region surrounding the lower-surface center region of the substrate held and rotated by the second substrate holder with the cleaning liquid supplied to the upper surface of the substrate, wherein the pressing and moving steps include moving the cleaning brush on the lower-surface outer region of the substrate while pressing the cleaning brush against the lower-surface outer region of the substrate with the cleaning liquid supplied to the upper surface of the substrate rotated by the second substrate holder and with the cleaning liquid supplied to the lower-surface outer region of the substrate.

7. The substrate cleaning method according to claim 5, wherein the cleaning brush is a lower-surface brush used to clean the lower surface of the substrate, and the lower-surface brush includes a base portion having a flat surface directed upwardly, and a first cleaning portion provided at the flat surface of the base portion so as to project upwardly from the flat surface of the base portion and extend along an outer edge of the base portion.

8. The substrate cleaning method according to claim 7, wherein the lower-surface brush further includes a second cleaning portion provided at the flat surface of the base portion so as to project upwardly from the flat surface of the base portion and extend in one direction through a geometric center of the base portion in plan view.

\* \* \* \* \*